(12) United States Patent
Hekmatpour et al.

(10) Patent No.: US 7,865,853 B2
(45) Date of Patent: Jan. 4, 2011

(54) SYSTEMS, METHODS, AND MEDIA FOR BLOCK-BASED ASSERTION GENERATION, QUALIFICATION AND ANALYSIS

(75) Inventors: Amir Hekmatpour, Cary, NC (US); Azadeh Salehi, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 526 days.

(21) Appl. No.: 11/936,775

(22) Filed: Nov. 7, 2007

(65) Prior Publication Data

US 2008/0066030 A1    Mar. 13, 2008

Related U.S. Application Data

(63) Continuation of application No. 11/136,256, filed on May 24, 2005, now Pat. No. 7,313,772.

(51) Int. Cl.
G06F 17/50   (2006.01)
(52) U.S. Cl. .................. 716/5; 716/1; 716/11; 716/18
(58) Field of Classification Search .................. 716/1, 716/5, 11, 18
See application file for complete search history.

(56) References Cited

U.S. PATENT DOCUMENTS

| | | | |
|---|---|---|---|
| 5,907,698 A | 5/1999 | Kucukcakar et al. |
| 6,081,864 A | 6/2000 | Lowe et al. |
| 6,185,723 B1 | 2/2001 | Burks et al. |
| 6,247,165 B1 | 6/2001 | Wohl et al. |
| 6,321,186 B1 | 11/2001 | Yuan et al. |
| 6,449,752 B1 | 9/2002 | Baumgartner et al. |
| 6,553,514 B1 | 4/2003 | Baumgartner et al. |
| 6,560,699 B1 | 5/2003 | Konkle |
| 6,591,402 B1 | 7/2003 | Chandra et al. |
| 6,591,403 B1 | 7/2003 | Bass et al. |
| 6,609,229 B1 | 8/2003 | Ly et al. |

(Continued)

FOREIGN PATENT DOCUMENTS

WO    WO 03/100704 A2    12/2003

(Continued)

OTHER PUBLICATIONS

Accelerating "Concept to RTL" for System-on-Chip Designs, 2003 Synopsys, Inc., pp. 1-126.

(Continued)

*Primary Examiner*—Thuan Do
(74) *Attorney, Agent, or Firm*—Daniel H. Schnurmann; Schubert Law Group PLLC

(57) ABSTRACT

Systems, methods, and media for block-based assertion generation, qualification and analysis are disclosed. Embodiments may include a method for generating assertions for verifying a design. The embodiment may include generating session preferences, the session preferences including a selection of one or more assertion schemas for use in generating the assertions, where the selected assertion schema each have one or more design attributes. The embodiment may also include parsing the design to determine locations in the design for the assertions based on the design architecture, structure, and hierarchy and generating the assertions based on at least the session preferences, the determined locations for the assertions, and the design attributes associated with the selected assertion schema. Generating the assertions may further include analyzing and modifying existing assertions based on the session preferences and design attributes or qualifying the assertions for consistency and compliance with the session preferences and design attributes.

8 Claims, 18 Drawing Sheets

U.S. PATENT DOCUMENTS

| | | | |
|---|---|---|---|
| 6,684,359 | B2 | 1/2004 | Noy |
| 6,751,583 | B1 | 6/2004 | Clarke et al. |
| 7,644,361 | B2 * | 1/2010 | Wu et al. ............... 715/273 |
| 2004/0181543 | A1 | 9/2004 | Wu et al. |

OTHER PUBLICATIONS

Research Disclosure, "Large Pages Using Power PC BATs," and "A Graphical Interface for Formulating CTL Rules for Model Checking," International Business Machines Corporation, Jun. 1998, pp. 841-842.

Research Disclosure, "An Iterative Method to Reduce State Space for Efficient Formal Verification," International Business Machines Corporation, Mar. 1998, p. 291.

Research Disclosure, "A Method to Optimize Environment Models in Format Verification," International Business Machines Corporation, Apr. 1999, pp. 537-538.

Non-Final Rejection Office Action for U.S. Appl. No. 11/942,148 (sister continuation of instant application), Jun. 16, 2010, USPTO, Alexandria, VA, USA.

* cited by examiner

| | |
|---|---|
| <INPUT> | (ALL INPUT PORTS OF THE CURRENT BLOCK) |
| <OUTPUT> | (ALL OUTPUT PORTS OF THE CURRENT BLOCK) |
| <SINK> | (ALL SINKS OF THE LEFT HAND SIDE SIGNAL/PORT/NET IN CURRENT BLOCK, INLINE FORMAT) |
| <SINK_&> | (ALL SINKS HOLD AT THE CURRENT CYCLE BUT THEY MAY/MAYNOT HOLD TO THE NEXT CYCLE) |
| <SINK_&&> | (ALL SINKS HOLD & COMPLETE IN THE SAME CYCLE) |
| <SINK_||> | (AT LEAST ONE OF THE SINKS HOLDS TRUE IN THE CURRENT CYCLE) |
| <SINKS> | (ALL SINKS OF THE LEFT HAND SIDE SIGNAL/PORT/NET IN CURRENT BLOCK, OPTIMIZED FORMAT) |
| <SINKS_&> | (ALL SINKS HOLD AT THE CURRENT CYCLE BUT THEY MAY/MAYNOT HOLD TO THE NEXT CYCLE) |
| <SINKS_&&> | (ALL SINKS HOLD & COMPLETE IN THE SAME CYCLE) |
| <SINKS_||> | (AT LEAST ONE OF THE SINKS HOLDS TRUE IN THE CURRENT CYCLE) |
| <SOURCE> | (ONE OR MORE SOURCE OF THE LEFT HAND SIDE SIGNAL/PORT/NET, ONE ASSERT PER SOURCE) |
| <SOURCE_&> | (ALL SOURCES HOLD AT THE CURRENT CYCLE BUT THEY MAY/MAYNOT HOLD TO THE NEXT CYCLE) |
| <SOURCE_&&> | (ALL SOURCES HOLD & COMPLETE IN THE SAME CYCLE) |
| <SOURCE_||> | (AT LEAST ONE OF THE SOURCES HOLDS TRUE IN THE CURRENT CYCLE) |
| <SOURCES> | (ONE OR MORE SOURCE OF THE LEFT HAND SIDE SIGNAL/PORT/NET, ONE ASSERT PER SOURCE) |
| <SOURCES_&> | (ALL SOURCES HOLD AT THE CURRENT CYCLE BUT THEY MAY/MAYNOT HOLD TO THE NEXT CYCLE) |
| <SOURCES_&&> | (ALL SOURCES HOLD & COMPLETE IN THE SAME CYCLE) |
| <SOURCES_||> | (AT LEAST ONE OF THE SOURCES HOLDS TRUE IN THE CURRENT CYCLE) |
| <SINK<N>> | (APPLY OPS TO N LEVEL SINKS OF THE LHS SIGNAL/PORT/NET IN CURRENT BLOCK, INLINE FORMAT) |
| <SOURCE<N>> | (APPLY OPS TO N LEVEL SOURCES OF LHS SIGNAL/PORT/NET IN CURRENT BLOCK, INLINE FORMAT) |
| : : | : : |

FIG 3

```
// UNCLOCKED_INPUT_CHANGE_SINK.TMPL
// PSL PROPERTY INPUT_SINK_CHANGES_EVENTUALLY = ALWAYS (<INPUT> -> EVENTUALLY <SINK>);
// PSL ASSERT INPUT_SINK_CHANGES_EVENTUALLY;

// SINK_ASSERTED_POSEDGE.TMPL
// PSL PROPERTY INPUT_SINK_CHANGES_@PECLK = ALWAYS (<INPUT> -> <SINK>) @POSEDGE(CLK);
// PSL ASSERT INPUT_SINK_CHANGES_@PECLK;

// ALL_SINKS_ASSERTED_SAME_CYCLE.TMPL
// PSL PROPERTY ALL_INPUT_SINKS_SAME_CYCLE = ALWAYS (<INPUT> -> <SINKS_&&>);
// PSL ASSERT ALL_INPUT_SINKS_SAME_CYCLE;

// SINK_SINKOFSINK_ASSERTED.TMPL - SINK ASSERTED AT CYCLE(T) AND SINK(SINK) AT CYCLE(T+1)
// PSL PROPERTY ALL_INPUT_SINKS_SAME_CYCLE = ALWAYS (<INPUT> -> {<SINK>; <SINK<SINK>>});
// PSL ASSERT ALL_INPUT_SINKS_SAME_CYCLE;

// OUTPUT_ASSERTED_NOT_ITS_SOURCE
// PSL PROPERTY OUTPUT_ASSERTED_NOT_SRC = NEVER (<OUTPUT> -> !<SOURCE_&&>);
// PSL ASSERT OUTPUT_ASSERTED_NOT_SRC;
```

// 1 BIT ADDER NETLIST
// VIEW - SCHEMATIC, LIBRARY - BLUEIP

`TIMESCALE 1NS / 1NS

MODULE ADDER_1BIT ( COUT, SUM, A, B, CIN );
OUTPUT COUT, SUM;
INPUT A, B, CIN;

NAND2X1 I21 ( .B(CIN), .A(B), .Z(NET042));
NAND2X1 I22 ( .B(CIN), .A(A), .Z(NET065));
NAND2X1 I20 ( .B(NET33), .A(NET29), .Z(NET8));
NAND2X1 I19 ( .B(CIN), .A(NET35), .Z(NET11));
NAND2X1 I24 ( .B(NET042), .A(NET30), .Z(NET036));
NAND2X1 I17 ( .B(B), .A(NET16), .Z(NET17));
NAND2X1 I16 ( .B(NET37), .A(A), .Z(NET20));
NAND2X1 I15 ( .B(NET8), .A(NET11), .Z(SUM));
NAND2X1 I25 ( .B(NET65), .A(NET0119), .Z(COUT));
NAND2X1 I13 ( .B(B), .A(A), .Z(NET30));
NAND2X1 I14 ( .B(NET20), .A(NET17), .Z(NET29));
INVX1 I26 ( .A(NET036), .Z(NET0119));
INVX1 I9 ( .A(CIN), .Z(NET33));
INVX1 I8 ( .A(NET29), .Z(NET35));
INVX1 I7 ( .A(B), .Z(NET37));
INVX1 I6 ( .A(A), .Z(NET16));

ENDMODULE

504

// SOCVER IO_SINK_SOURCE_NETLIST
// 1BIT ADDER - GENERATED 05/25/04

// IO LIST
OUTPUT COUT, SUM;
INPUT A, B, CIN;

// IO SINK LIST
A: NET16, NET20, NET30, NET065
B: NET17, NET37, NET30, NET042
CIN: NET11, NET33, NET042, NET065
COUT:
SUM:

// NETS SINK LIST
NET8: SUM
NET11: SUM
NET16: NET17
NET17: NET29
NET20: NET29
NET29: NET8, NET35
NET30: NET036
NET33: NET8
NET35: NET11
NET37: NET20
NET036: NET0119
NET042: NET036
NET065: COUT
NET0119: COUT

FIG 5

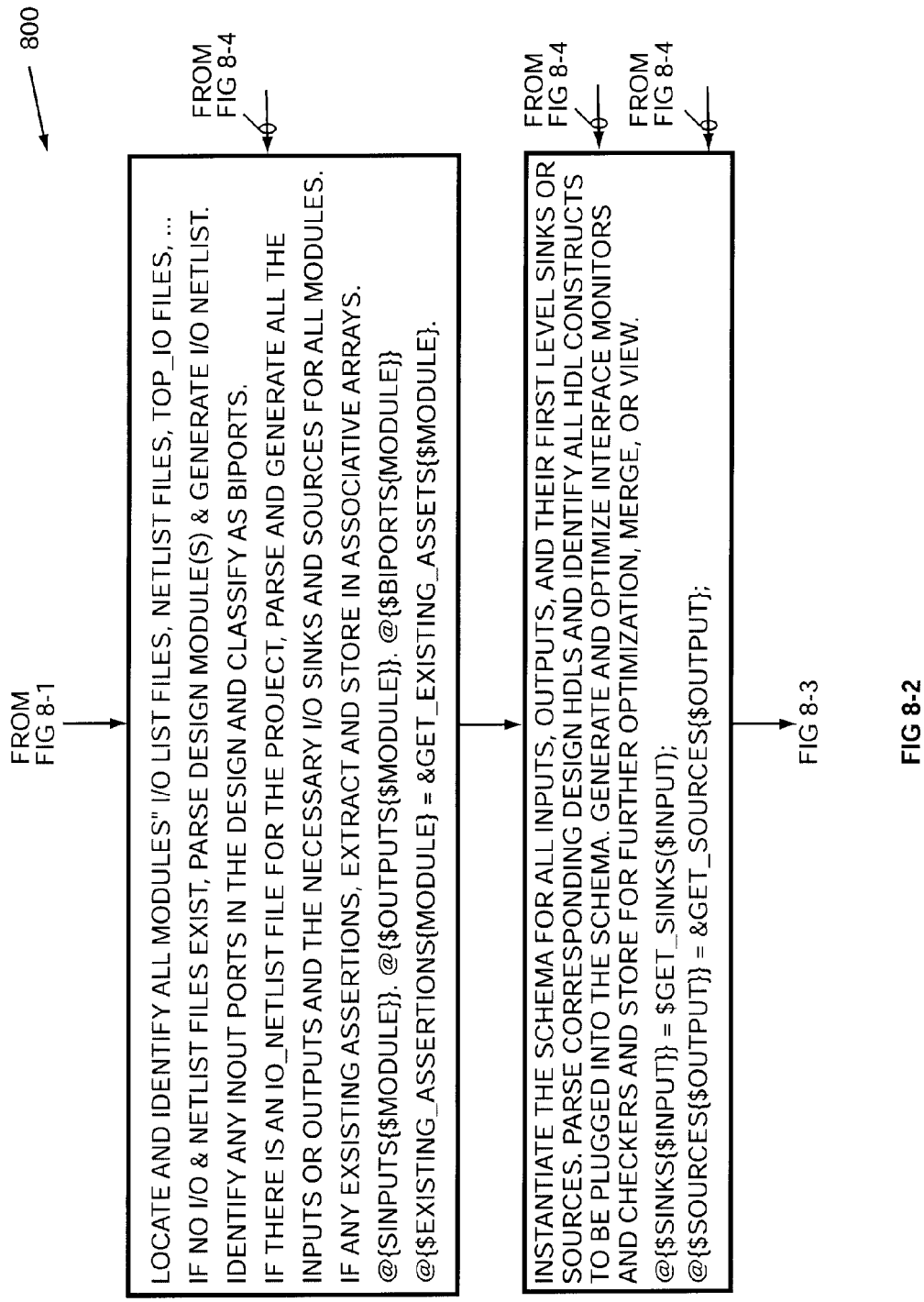

SYSTEMS, METHODS, AND MEDIA FOR BLOCK-BASED ASSERTION GENERATION, QUALIFICATION AND ANALYSIS

CROSS-REFERENCES TO RELATED APPLICATIONS

Pursuant to 35 USC §120, this continuation application claims priority to and benefit of U.S. patent application Ser. No. 11/136,256, entitled "SYSTEMS, METHODS, AND. MEDIA FOR BLOCK-BASED ASSERTION GENERATION, QUALIFICATION, AND ANALYSIS", filed on May 24, 2005, now U.S. Pat. No. 7,313,772 the disclosure of which is incorporated herein in its entirety for all purposes.

FIELD OF INVENTION

The present invention generally relates to the field of functional verification of complex systems. More particularly, the present invention relates to systems, methods, and media for block-based assertion generation and analysis for functional verification of Integrated Circuit (IC) chip designs.

BACKGROUND

Design of an IC chip, including its architecture, is a very complex, expensive, and time-consuming task, making verification of that design before fabrication critical. When designing increasingly complex processors or Integrated Circuit (IC) chips such as Application-Specific ICs (ASICs) and system-on-chips (SoC's), functional verification of the design has proven to be a major bottleneck in achieving time-to-market goals. Verification of the design of a complex system such as an IC chip is an iterative process where the entire system (or at least all of its major features) is tested on a continuous basis for the duration of the design. As the design complexity increases, so does the state space and the number of functional states and finite state machines that need to be verified. In a typical microprocessor design environment, billions of simulation cycles are required to verify all features of the design. Design teams report that functional verification of medium- to large-complexity processors, ASICs or SOC's may consume over 70% of the project's manpower, schedule and budget. In spite of the time and resources consumed by functional verification, it is still often incomplete, allowing design bugs to go undetected.

The design process for an IC chip starts with the creation of a functional specification for the design. Once the functional specification has been completed, the verification team typically creates a test plan that specifies the design features and functions to be tested at both the block and system levels. The verification team then creates testbenches (also known as tests) such as deterministic tests and tests automatically generated to verify design functionality until all test plan requirements have been met. The process of verifying the functional specification is called functional verification, which encompasses the development and implementation of this test plan.

Functional verification ensures functional conformance of an integrated circuit design to its architectural and microarchitectural specifications and determines whether a design is logically correct. The verification process involves developing and simulating tests that are used to determine whether design components (e.g., processor units, resources, functions, etc.) behave according to their functional specification. Functional verification is typically completed before fabrication of the processor, as finding and fixing errors, or bugs, after fabrication proves to be time-consuming and expensive.

To manage the verification of today's complex designs and to be responsive to frequent design specification changes and upgrades, an efficient, iterative process that may be used throughout the duration of the design is desired. To alleviate the burden of frequent design specification changes and upgrades, regression testing is often adopted. Regression testing involves the repetitive testing of a design's major features to ensure changes and upgrades to the design have not introduced new bugs into the system. Verification is a major component of the design process and efficient management of its tasks and resources are important in reducing the number of design iterations and optimizing the length of each iteration. Improved functional verification can cut costs, improve design quality and accelerate time-to-market. In addition, improved functional verification enables companies to sharply increase the productivity of their precious resource, verification personnel.

Different methods have been developed to improve the quality and efficiency of functional verification. These methods include formal verification methods and Assertion-based verification (ABV) methods. Using formal verification methods, testers design tests and run simulations against a compiled model of the design to exercise the tests and to identify any deviations from the formal specification or rules. Some verification tools can generate a set of assertions such as checkers and monitors from the formal rules which can then be used to facilitate the simulation-based verification. In contrast, ABV often relies on arbitrary or non-test plan based factors instead of formal rules. Design and verification engineers define assertions such as checkers and monitors that define verification targets such as design features that need to be verified or critical sequences of operations to be monitored.

Current ABV tools and methods provide mechanisms for designers to define assertions in one or more commonly used languages (e.g., PSL, Verilog, VHDL, C, e, etc.). These assertions are then folded into the verification test bench manually by a designer and exercised during verification. The designer then reviews the simulation output to determine if the assertions worked properly. The verification bottleneck of traditional simulation-based verification (including test generation, simulation, and coverage analysis) has thus been shifted but not eliminated. Defining assertions, ensuring their completeness and accuracy, and maintaining a large number of assertions throughout the architectural and specification changes have proven to be the new verification bottleneck.

Some Electronic Design Automation (EDA) companies (e.g., Mentor Graphics Corporation's 0-in business unit, Cadence Design Systems Inc., etc.) have attempted to make ABV more efficient by providing static design analysis tools and checkerware libraries. These tools, however, do not provide a mechanism for the user to customize the checker libraries during the verification process. These tools also generally require manual generation of assertions, a resource-intensive process. Any assertions generated by these tools are primitive assertions with no visibility to the designer and may only be used within the black-box environment of the tool. Other tools require designers to manually define and maintain verification assertions, requiring significant user effort and time.

There is, therefore, a need for an effective and efficient system to manage Assertion-based verification. There is an even greater need for such a system as the complexity of designs to be functionally verified continues to increase.

SUMMARY OF THE INVENTION

The problems identified above are in large part addressed by systems, methods, and media for block-based assertion generation, qualification and analysis. One embodiment generally provides a method for generating assertions for verifying a design. The method may generally include generating session preferences where the session preferences include a selection of one or more assertion schema for use in generating one or more assertions and the selected assertion schemas each have one or more associated design attributes. The method may also generally include parsing the design to determine locations in the design for the one or more assertions based on the design architecture, structure, and hierarchy. The method may also include generating the one or more assertions based on at least the session preferences, the determined locations for the one or more assertions, and the design attributes associated with the selected assertion schema. Session preferences in a further embodiment may include one or more of a selected assertion schema from a library, a modified assertion schema from a library, and a fully customized assertion schema. In a further embodiment, generating the one or more assertions may include analyzing and modifying existing assertions based on the session preferences and design attributes or qualifying the assertions for consistency and compliance with the session preferences and design attributes.

Another embodiment provides a machine-accessible medium containing instructions that are effective when executed in a data processing system to cause the system to perform a series of operations for generating assertions for verifying an integrated circuit system. The series of operations generally includes generating session preferences where the session preferences include a selection of one or more assertion schema for use in generating one or more assertions and the selected assertion schemas each have one or more associated design attributes. The series of operations may also generally include parsing the design to determine locations in the design for the one or more assertions based on the design architecture, structure, and hierarchy. The series of operations may also include generating the one or more assertions based on at least the session preferences, the determined locations for the one or more assertions, and the design attributes associated with the selected assertion schema.

A further embodiment provides an assertion generation system for use in verifying a design. The system may include a user interface for receiving an indication of session preferences from a user and an assertion generator for generating one or more assertions based on the session preferences and for embedding the one or more assertions into the design. The system may also include an assertion analyzer for analyzing and optimizing the one or more assertions generated by the assertion generator and an assertion qualifier for checking the coverage and compliance of the one or more assertions generated by the assertion generator. Further embodiments of the system may include a database having a library containing one or more assertion schemas.

BRIEF DESCRIPTION OF THE DRAWINGS

Other objects and advantages of the invention will become apparent upon reading the following detailed description and upon reference to the accompanying drawings in which, like references may indicate similar elements.

DETAILED DESCRIPTION OF EMBODIMENTS

Figure 1:
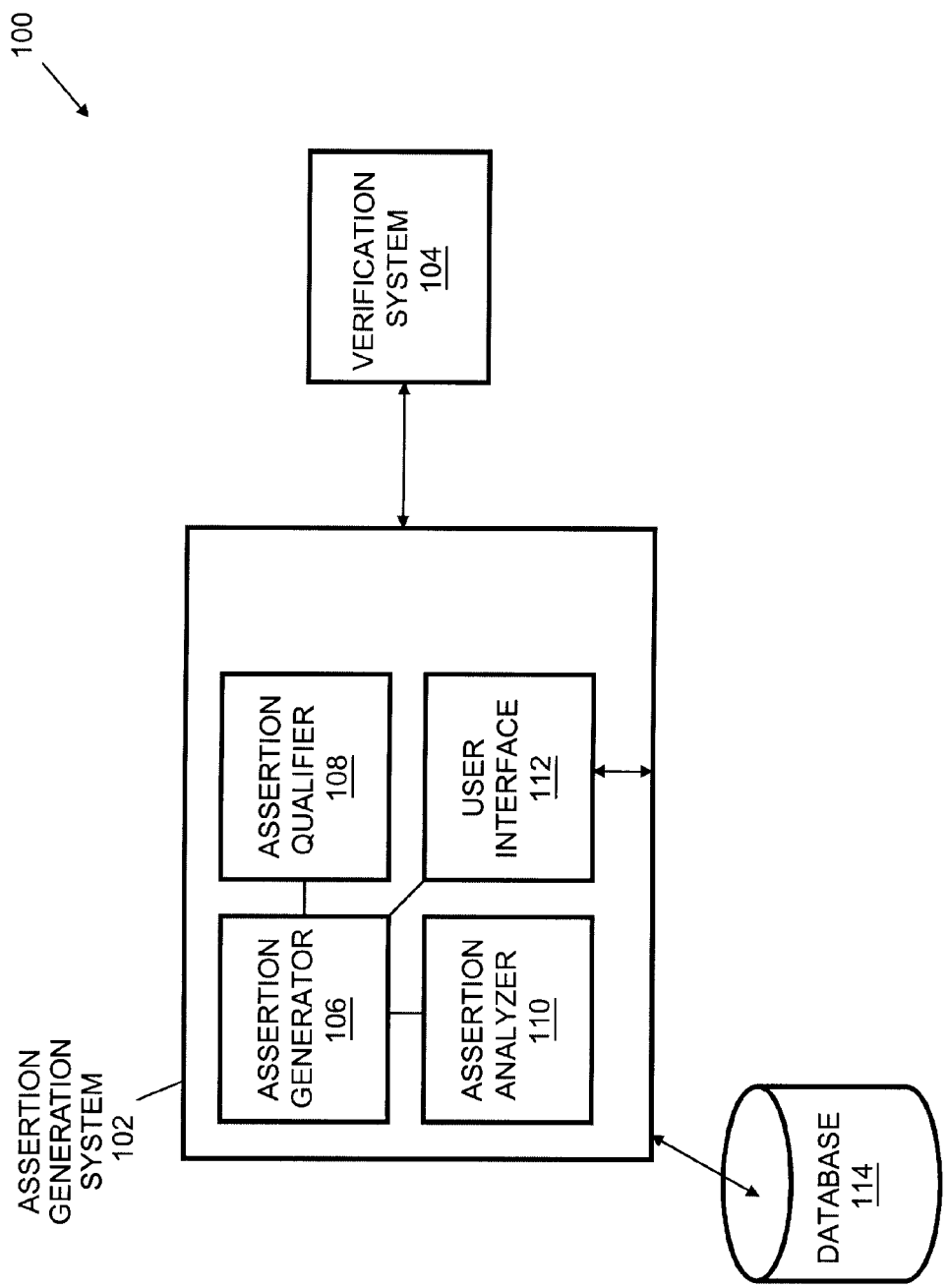
FIG. 1 depicts a schematic view of a functional verification system with an assertion generation system according to one embodiment.

The following is a detailed description of example embodiments of the invention depicted in the accompanying drawings. The example embodiments are in such detail as to clearly communicate the invention. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Systems, methods, and media for block-based assertion generation, qualification and analysis are disclosed. Embodiments may include a method for generating assertions for verifying a design. The embodiment may include generating session preferences, the session preferences including a selection of one or more assertion schemas for use in generating the assertions, where the selected assertion schema each have one or more design attributes. The embodiment may also include parsing the design to determine locations in the design for the assertions based on the design architecture, structure, and hierarchy and generating the assertions based on at least the session preferences, the determined locations for the assertions, and the design attributes associated with the selected assertion schema. Generating the assertions may further include analyzing and modifying existing assertions based on the session preferences and design attributes or qualifying the assertions for consistency and compliance with the session preferences and design attributes. Selection of the assertion schema and the determined location in the design for the assertions may be influenced by the analysis of the design architecture, structure, and hierarchy.

The systems, methods, and media of the disclosed embodiments provide an improved methodology for the generation of assertions used for dynamic simulation and formal verification of designs such as IC chip designs. Assertion generation, which may be automatic, may be based on the block-level structural analysis of the design. A block may be a design unit or sub-unit such as a function, an HDL (Hardware Design Language) module, a hard macro, a soft macro, or any other partitional component of the design. The design HDL may be analyzed and relevant HDL constructs identified. For each class of design blocks, at least one best-fit assertion schema may be extracted from the library and instantiated into the design description for use in simulation and/or verification.

Users may select schema from a library of existing schema and customize them or define new assertion schema for their particular project. Assertions may then be generated by instantiating the selected schema for the corresponding design constructs (e.g., a unit, a block, a function, etc.). The user may then accept the generated assertions, regenerate the assertions with new constraints, or restart with a different set of schema. The resulting assertions may be optimized for the target verification environment and embedded in the design HDL or compiled as stand-alone verification modules. A direct analysis of the assertion schema may provide an indication of the operations to be performed on the design, the HDL constructs on which to apply the assertion operations, and how the schema code snippet may be instantiated into the design HDL.

In addition to automatic generation of assertions, the disclosed system may also extract and analyze existing assertions in a design HDL or identify missing or incomplete scenarios. The disclosed system may advantageously be model-based and may provide a flexible mechanism for constructing and processing assertions.

Turning now to the drawings, FIG. 1 depicts a schematic view of a functional verification system with an assertion generation system according to one embodiment. Functional verification system 100 may include an assertion generation system 102 that may generate assertions and communicate those generated assertions to a verification system 104 for use in the functional verification process. The functional verification system 100 may verify the functionality of a design such as an IC chip or any other type of design. The verification system 104 may provide for verifying designs with defined or generated assertions via simulation or formal analysis. Assertions, which include monitors and checkers, may be pieces of code that check and/or report on the operation of a design. The assertion generation system 102 may be in communication with a database 114 for storage of generated assertions, assertion schema libraries, user preferences, design module HDL source code, or any other information.

The assertion generation system 102 (as well as other components of the functional verification system 100) may, in one embodiment, be software implemented on one or more of any type of computer system, including servers, personal computers, workstations, mainframe computers, notebook or laptop computers, desktop computers, or the like. In one example, the assertion generation system 102 may be implemented on an IBM® eServer or similar server having one or more processors, or threads of processors, executing software and/or one or more state machines coupled with data storage devices such as random access memory (RAM), read only memory (ROM), flash memory, compact disk drives, hard drives, and the like. The components of the functional verification system 100 may be in communication with each other by any means. In one embodiment, a network such as the Internet, an intranet, a LAN, a WAN, an Ethernet network, or a wireless network may connect components. In another embodiment, the assertion generation system 102, the verification system 104, and/or database 114 may be part of the same computer system. Those skilled in the art will recognize that the functional verification system 100 may utilize any type of data communication channel between components and may be implemented on any type or combination of computer systems without departure from the scope and spirit of the invention.

The assertion generation system 102 may include an assertion generator 106, an assertion qualifier 108, an assertion analyzer 110, and a user interface 112. The assertion generator 106 may automatically generate and embed or place assertions within a design based on the particulars of the design to be tested, user-defined preferences or biases, design constraints, verification environment requirements, or other factors. As part of the generation and placement of assertions, the assertion generator 106 may take advantage of the results of the analysis of the design performed by the assertion analyzer 110. As will be described in more detail subsequently (particularly in relation to FIGS. 6-9), the assertion generator 106 may automatically generate assertions for placement or embedding into the design to be tested using a model-based methodology. The assertion generator 106 may utilize an existing library of assertion schema as well as updated or custom assertion schema for a fully directed and customized assertion generation methodology.

The assertion generator 106 may use a block-based methodology to provide additional benefits to designers or other users in customizing results and improving efficiency. As described in more detail in relation to FIG. 2, by assigning assertions at a design block level, the assertion generator 106 may provide users with improved flexibility and efficiency in generating assertions. A user, for example, may request that a certain preference be only applied to a particular block or group of blocks, giving the user significant flexibility in customizing the generated assertions. In another example, a user may request that certain blocks in the design be ignored for a particular verification environment, resulting in the assertions from those blocks being absent in the verification environment and saving potentially large amounts of computing resources. This may be useful, for example, where the selected blocks have already been fully verified or are not yet complete (making verification of those blocks untimely).

The assertion qualifier 108 may check the coverage and compliance of the assertions generated by the assertion generator 106 for factors such as consistency, accuracy, and completeness. A user may define preferences or biases for the operation of the assertion qualifier 108 on one or more blocks' assertions. In one embodiment, the assertion qualifier 108 may check for the completeness of the coverage of the assertions, such as by determining whether the generated assertions cover the necessary aspects of the design. For example, the assertion qualifier 108 may check to see if a new input or output in the design has an associated assertion that is generated. In a further embodiment, the assertion qualifier 108 may also check for assertion consistency in the design, such as by ensuring consistency in assertions requested or generated by different designers, at different times, or the like. The assertion qualifier 108 may also check for compliance with a particular standard or group of standards, which may prove useful when assertions are generated by different individuals on a design team or by different unit design teams.

The assertion analyzer 110 may analyze and optimize the assertions generated by the assertion generator 106. A user may define preferences or biases for the operation of the assertion analyzer 110 on one or more design blocks. In one embodiment, the assertion analyzer 110 may reformat, regroup and/or combine assertion code to optimize processing time, reporting, or other aspects to improve the efficiency of the assertion code. The assertion analyzer 110 may also merge or combine redundant assertions, freeing up unnecessary computational expenditures. The assertion analyzer 110 may also eliminate (deactivate) unnecessary assertions when a user deselects particular blocks so that those assertions need not be included in the final code, saving additional verification resources.

The user interface 112 may receive input from users and provide output to users to and from the assertion generation system 102. Any mechanisms or methodologies for receiving input (e.g., keyboard, mouse, user interface, voice command, etc.) or providing output (e.g., display, audio output, printouts, etc.) may be used. In one embodiment, a user may access the assertion generation system 102 via a wired or wireless connection to the Internet or other network utilizing a web-based user interface 112 executing on a computer system. This embodiment may advantageously provide a user-friendly interface accessible by a distributed design team.

In combination, the components of the assertion generation system 102 provide for model-based automatic generation of user-directed and design-biased assertions for either ABV or functional verification. The assertion generation system 102 may embed the assertions in the design HDL or provide them in a separate design module. The model-based architecture enables constraint-driven qualification and analysis of the generated assertions. The assertion generation system may allow for user-defined biases and preferences, as well as design constraints and verification environment requirements for consideration in generating, optimizing and maintaining a design assertion schema library. The assertion generation system 102 may provide mechanisms for design and verification engineers to describe preferences as well as to include their own hand-coded or third-party assertions to be used with the automatically generated assertions. Existing assertion schemas may also be updated for fully directed and customized assertion generation. When compared to previous systems, the system of the disclosed embodiments may provide for increased flexibility, accuracy, and computational efficiency while reducing the resources necessary to create assertions.

Figure 2:
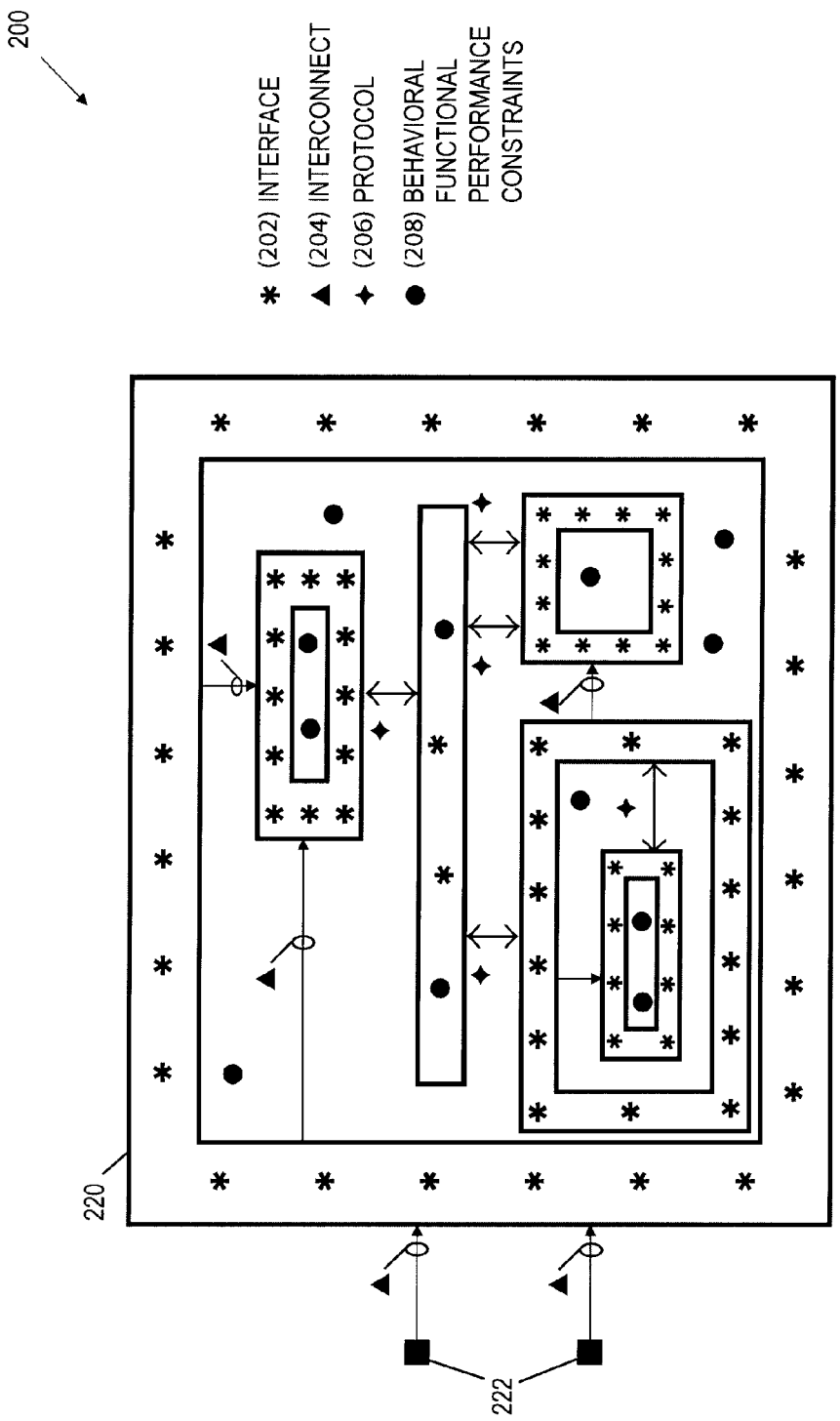
FIG. 2 depicts a schematic view of design blocks and some sample assigned assertions located in a chip design according to one embodiment.

FIG. 2 depicts a schematic view of design blocks and some sample assigned assertions located in a chip design according to one embodiment. Chip design 200 may include a number of different components as well as a plurality of assertions embedded in different layers of hierarchy in the design. The assertions may be divided into a series of classes. Classes of assertions may include interface (boundary), interconnect, protocol, functional, behavioral, performance, or constraint assertions. The component squares and rectangles of chip design 200 may be a design module (design block) representing different functions of the design at different levels of the hierarchy. Design blocks may be located fully within other blocks or may be otherwise connected to other blocks.

The chip level 220 of the design hierarchy may be the highest hierarchy level and may include a plurality of design blocks representing different levels of the design hierarchy. The chip level 220 may include one or more embedded interface assertions 202 for checking top level I/O behavior, block/module/IP interface properties and requirements, usage restrictions, toggle requirements, or the like. The chip level 220 of the design hierarchy may also have one or more inputs 222, each of which may have one or more embedded interconnect assertions 204. Interconnect assertions 204 may check external connections such as system I/O to chip I/O or chip I/O to internal port or net interconnect. Interconnect assertions 204 may also check internal connections such as unit-unit, unit-bus, block-unit, unit-core, core-core, core-chip, or core-bus interconnects. In one example, the interconnect assertions 204 may check the input from the outside of the chip design to ascertain whether the connection is proper and has been tested, such as by making a change to one side of the connection and observing the other side of the connection to determine if it changed accordingly. The interconnect assertions 204 may also apply internally (in addition to externally) to connections from input pins to components of the chip design 200.

Protocol assertions 206 may be similar to interface assertions 202 and apply to the interface or connection between two components or blocks of the chip design 200. In one embodiment, protocol assertions 206 may be based on defined standards such as bus protocols or the PCI protocol. Protocol assertions 206 may check any type of protocols such as bus protocols, chip-bus protocols, IP-bus protocols, or IP-IP protocols. Internal assertions 208 such as behavioral, functional, performance (e.g., timing) and temporal constraint (e.g., operating sequence) assertions may be located inside blocks of logic of the chip design 200, in contrast to the interconnect assertions 204 which may be located at the boundaries of blocks.

The assertion generation system 102 may automatically parse the different blocks within a chip design 200 and identify input and output for each, assigning the proper assertions in appropriate places in the design HDL. The assertion generation system 102 may, for example, place internal assertions 208 inside of design blocks, protocol assertions 206 in between design blocks, and so on. By assigning the proper assertions throughout the design HDL, the assertion generation system 102 may advantageously eliminate the need for a designer to manually assign assertions within the design HDL.

The functional verification system 100 may include a library of assertion schema (which may be stored at database 114) for use in generating assertions by the assertion generation system 100. A representation of an assertion schema internal to the assertion generation system 100 may include a number of attributes (also known as design attributes) in addition to an assertion code snippet (as described in relation to FIG. 4) and one or more associated language extension constructs and operations (as described in relation to FIG. 3). Snippets may represent a piece of assertion code, such as HDL-flavored PSL assertion code. In addition to a Class (e.g., Interface, Protocol, Interconnect, Functional, Behavioral, etc.) as described previously in relation to FIG. 2, assertion schema may have attributes such as Type, Name, Expression, Message, Severity Level, or Conditions.

Assertion Type may indicate the assertion schema as either a monitor or checker. A monitor assertion may monitor the design space or the verification process for a specific event. When an event occurs, its corresponding attributes (e.g., where, when, how, etc.) may be recorded. In contrast, a checker assertion may check to ensure that an event or sequence of events happens and performs some sort of reporting. In one example, a checker written for a forbidden scenario will trigger if the scenario ever becomes visible during the verification, and no message or report is generated if the scenario does not occur.

The assertion generation system 102 may also utilize other assertion attributes. The Name attribute may uniquely identify the function/unit/IP including the assertion. The Expression attribute may specify the operation mode, restriction, requirements, operation sequences, or the like in a supported language. The Message attribute may, in one embodiment, include an Assert message associated with the unique assertion name, type, and severity of the assertion. The Severity Level attribute may include information about the severity level of triggering the assertion, such as generating messages indicating a failure, error, warning, or information.

The assertion generation system 102 may classify the Condition attribute of assertions as either pre-condition asserts or post-condition asserts. Pre-condition asserts may require that all pre-conditions must be satisfied to use the block (IP, core, or function) in an acceptable and reliable manner. Pre-condition asserts, which may be precursors to post-condition asserts, may be considered "show-stoppers" as they must be satisfied for the verification process to continue. Post-condition asserts may specify what the block or function will do and the properties it will satisfy and may described the functional behavior properties of the block or function. Post-condition asserts may assume that all pre-condition asserts are fully satisfied.

Using the assertion generation system 102, a user may access existing assertion schema templates in a library, modify existing schema, create new schema, and save any modifications or newly created schema for later use by themselves or others. The assertion schema may be in any HDL, such as Verilog, VHDL, or PSL. Assertion schema templates may allow for flexible and powerful application of the assertion templates throughout the design. As will be described in more detail subsequently, a user may select a template for use in a project and the assertion generation system 102 may automatically identify all design modules, nets, ports, wires or facilities for which the selected assertion is applicable. Assertion schema templates may be example assertion schemas that users may access as examples or starting points for customized schemas. The assertion generation system 102 may then instantiate the template for each assertion instance and insert the generated code into the design HDL. This may provide an efficient way for a user to quickly and accurately assign assertions throughout a design. As an alternative, a user may also specify design modules, nets, ports, etc. where a selected template should be applied.

In one example, a user may select an interconnect assertion template in the Verilog HDL. In this example, there may be two interconnects between two different blocks of the design. The assertion generation system 102 may generate two interconnect assertions 206 based on the selected template for placement between the blocks. If the first interconnect between the two blocks was, for example, between signal 1 of the first block and signal 99 of the second block, the assertion generation system 102 may take those signals, instantiate the template for each block, plug the signals into the instantiated template to generate assertion code, and insert the generated interconnect assertion 206 at the right place in the design code. If the user decided to modify or change the template, the assertion generation system 102 may automatically perform the same process with the new template, replacing the previous code with new code based on the new template. This feature, along with the block-level approach, may allow users to efficiently apply different templates to different parts of the design. One part of the design may be configured such that all assertions are expected to validate within five cycles. Another module may be less aggressive and instead use the temporal attribute 'eventually' in its template expecting the assertions to validate sometime during the session rather than be restricted to within five cycles. Particularly templates may therefore advantageously be applied to all or part of a design.

Figures 1, 8:
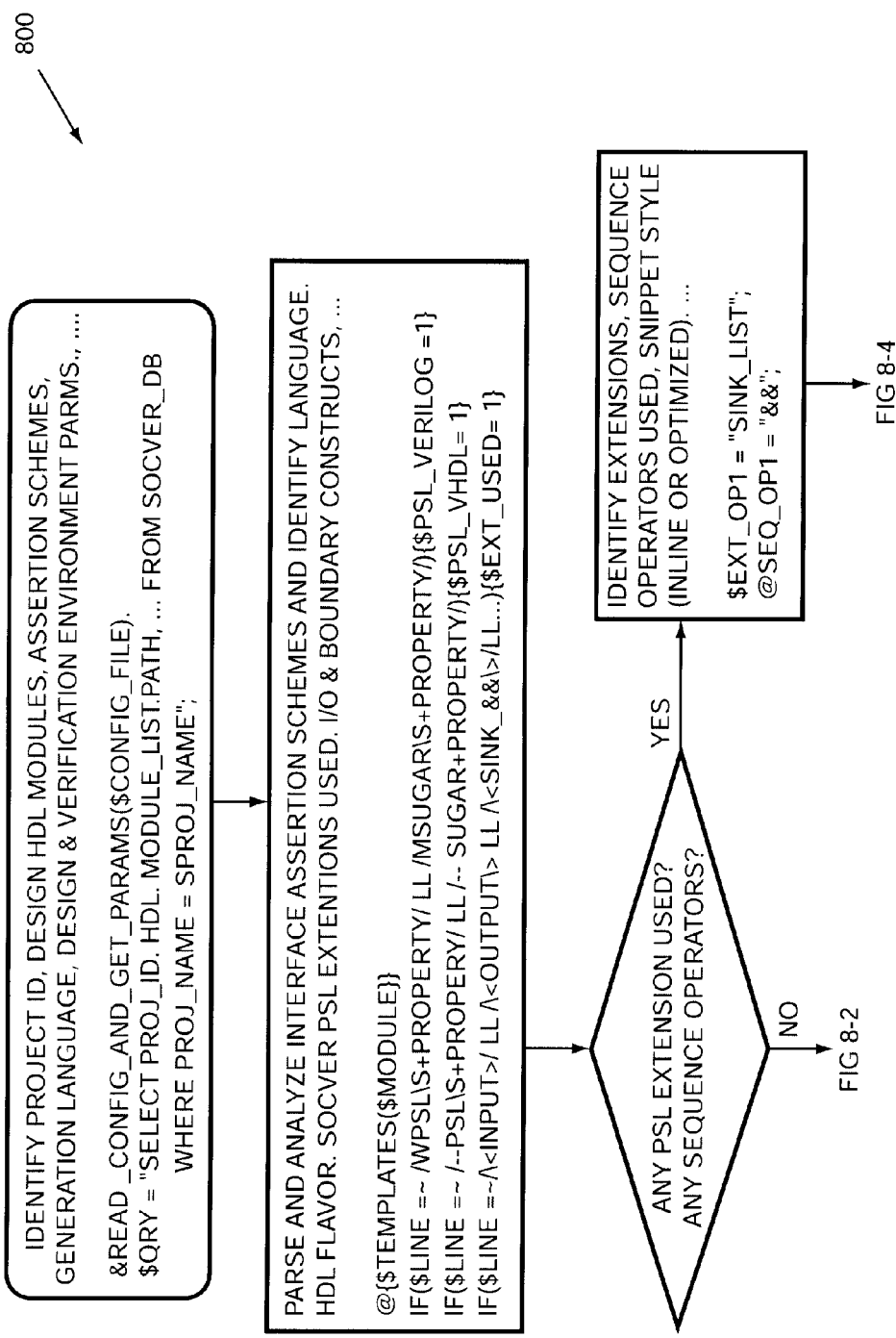
FIG. 8 depicts an example of a flow chart for generating an interface assertion according to one embodiment.
Figures 3, 8:
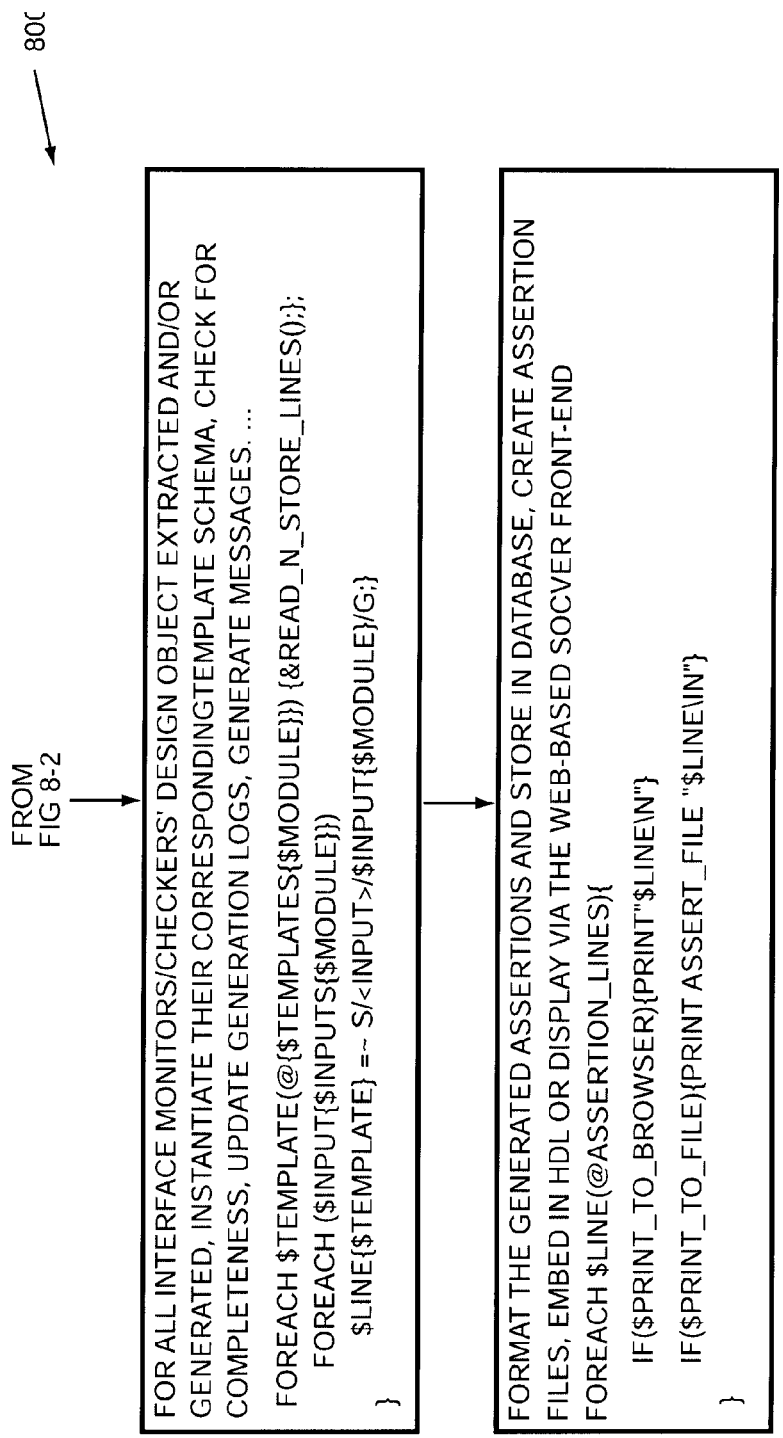
FIG. 3 depicts a table including example language constructs and operators for use as extensions to existing assertion specification languages for use in the assertion generation system of FIG. 1 according to one embodiment.

FIG. 3 depicts a table including example language constructs and operators for use as extensions to existing assertion specification languages for use in the assertion generation system of FIG. 1 according to one embodiment. Table 300 includes a language construct column 302 and a description column 304 in the depicted embodiment. The language construct column 302 may include a list of language construct extensions and operators that a user may specify for an assertion generated by the assertion generation system 102. This list of language construct extensions and operators may be considered non-exhaustive list of constructs and operators that may serve as an extension to PSL or other languages that may be utilized with the disclosed embodiments. The description column 304 includes a description of the extensions specified in column 302. Using these assertion extensions a user may define the target of a template and its temporal attributes. For example, specifying the <output> extension tells the assertion generation system 102 that the template is applicable to all output ports of the current block.

Figures 4, 8:
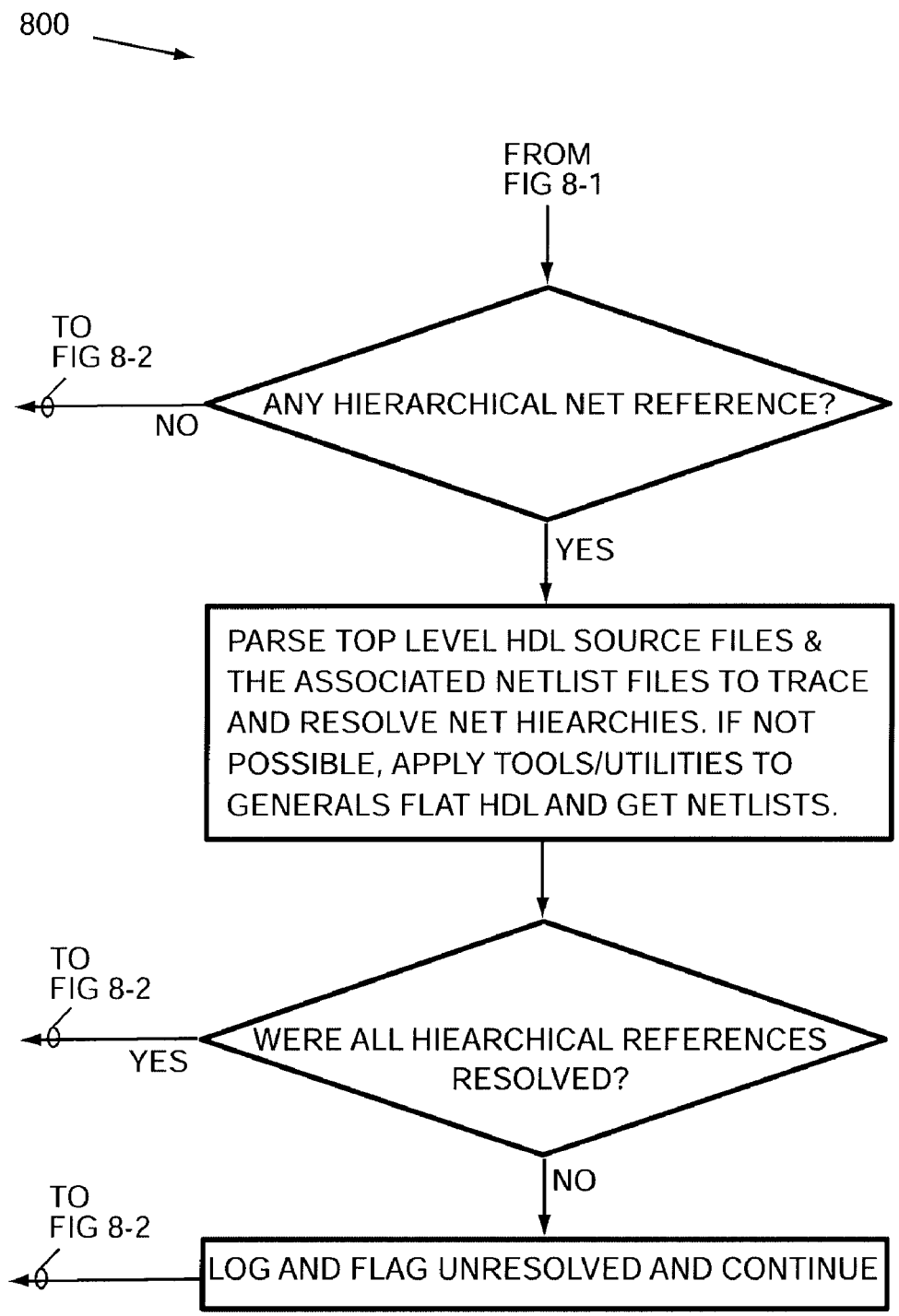
FIG. 4 depicts a table including sample assertion schemas snippets for use with the assertion generation system of FIG. 1 according to one embodiment.

FIG. 4 depicts a table including sample assertion schemas snippets for use with the assertion generation system of FIG. 1 according to one embodiment. Table 400 includes sample assertion schema PSL code snippets utilizing some of the language extensions and operators described in relation to FIG. 3. The language used in the examples of table 400 represent an HDL-flavored PSL assertion code that is an extension of PSL. While the examples of FIG. 4 are shown as an exemplary example, one skilled in the art will recognize that any software language may be utilized with the disclosed embodiments. The snippets of FIG. 4 illustrate how a user may use the extensions from FIG. 3 to apply global attributes in different HDL languages. In one example, the first snippet uses <input> and <sink> 'always' to mean that eventually the input's sink port has to change. When an input port is validated the assertion generation system 102 will replace <input> with an input signal and <sink> with the input signals' corresponding sink signal from the design's sink_source netlist (similarly to column 504 of FIG. 5 described subsequently). After replacing <input> and <sink>, the assertion generation system 102 may instantiate templates based on the new inputs and generate an assertion snippet. Previously, designers had to manually write a snippet for each signal, a laborious and inefficient process.

Figures 1, 9:
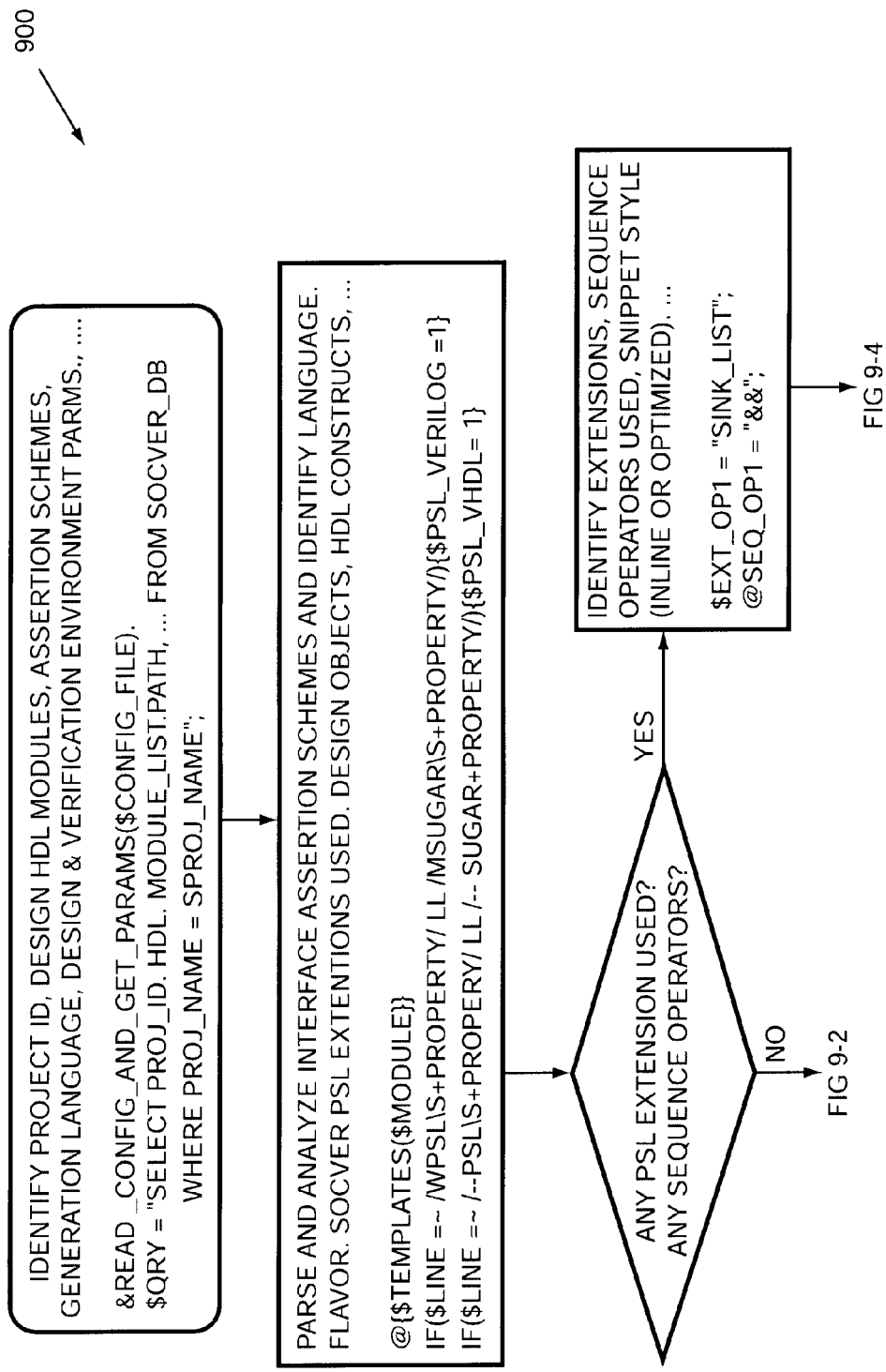
FIG. 9 depicts an example of a flow chart for generating an interconnect assertion according to one embodiment.
Figures 2, 9:
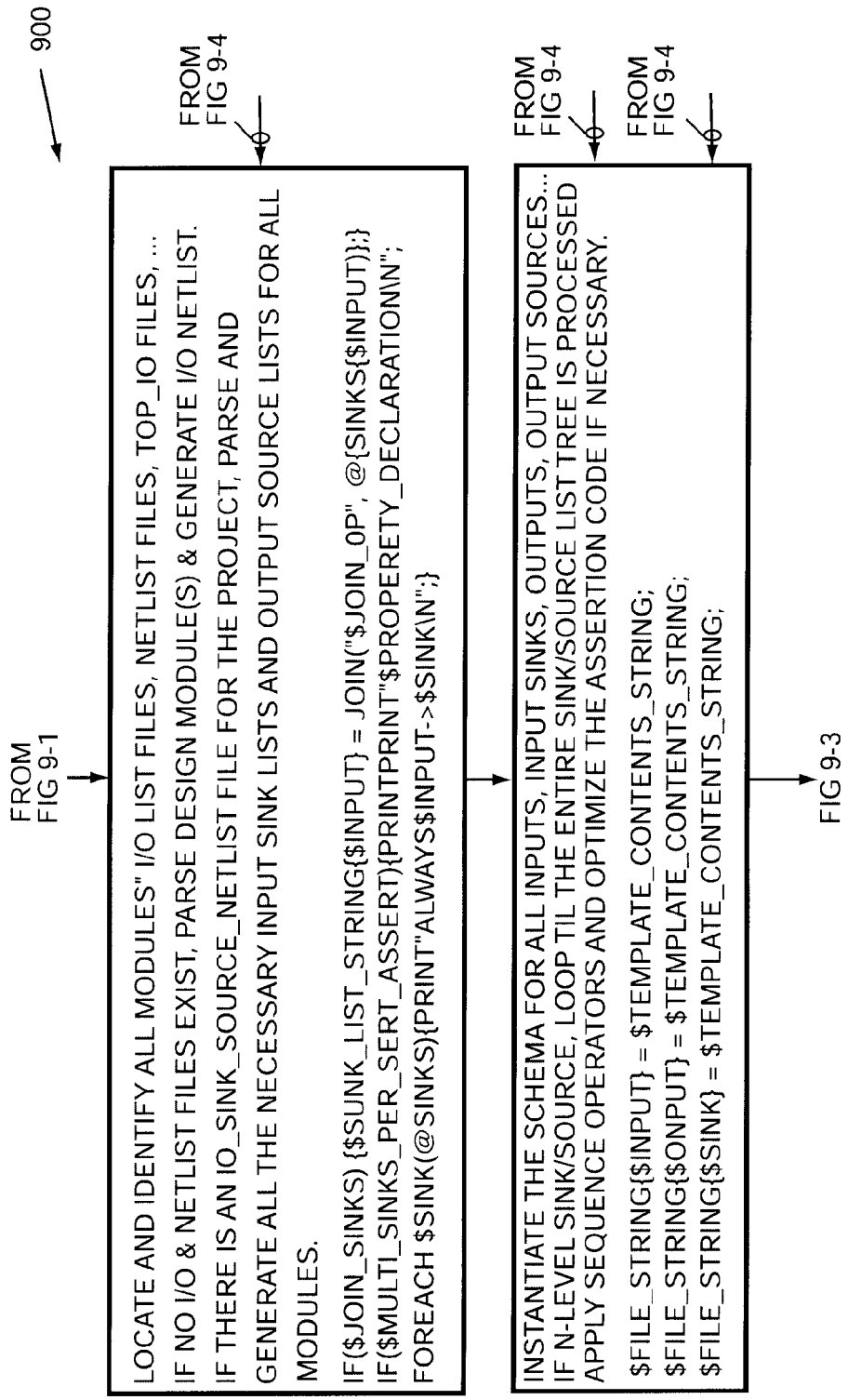
Figures 3, 9:
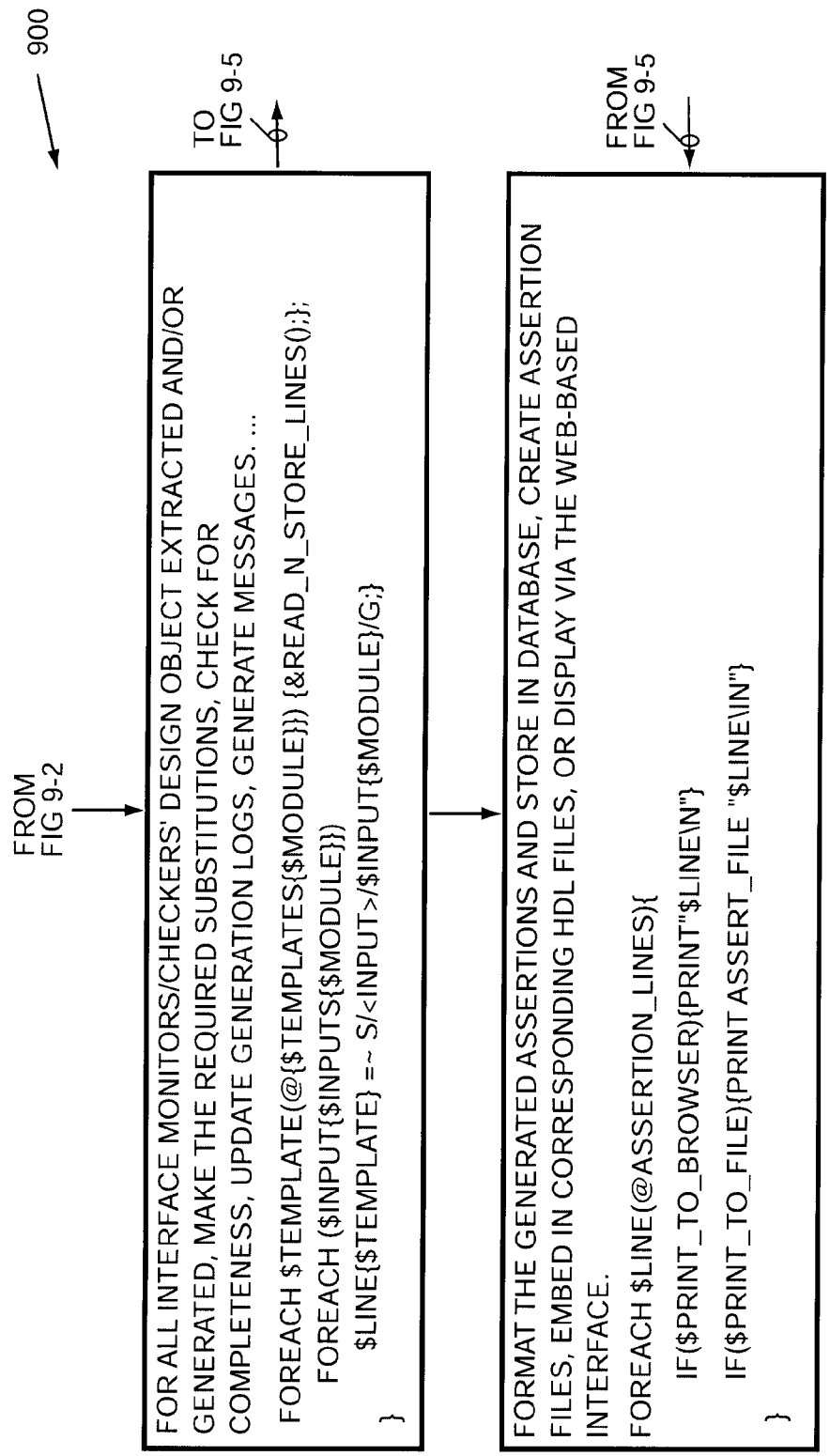
Figures 4, 9:
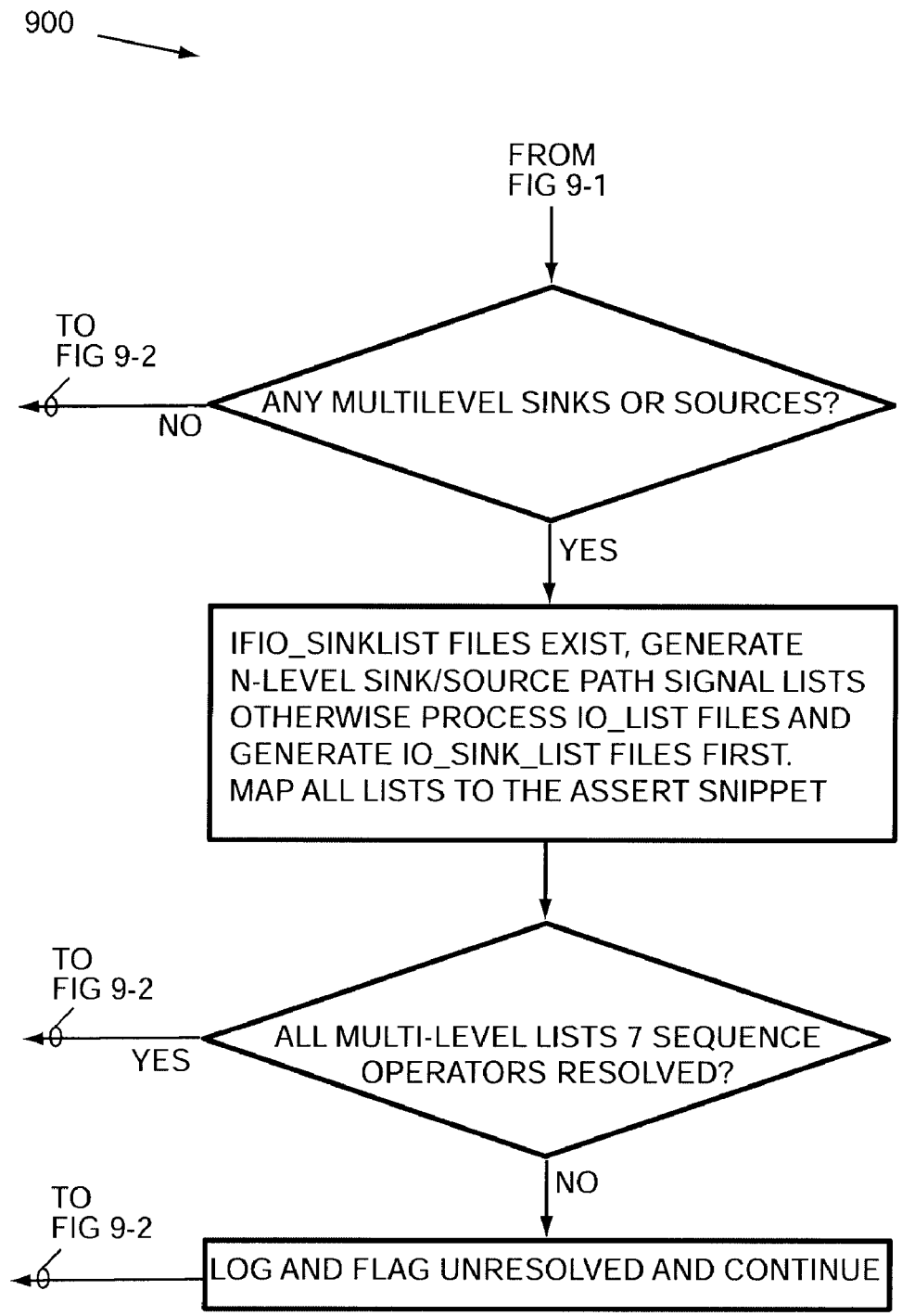
Figures 5, 9:
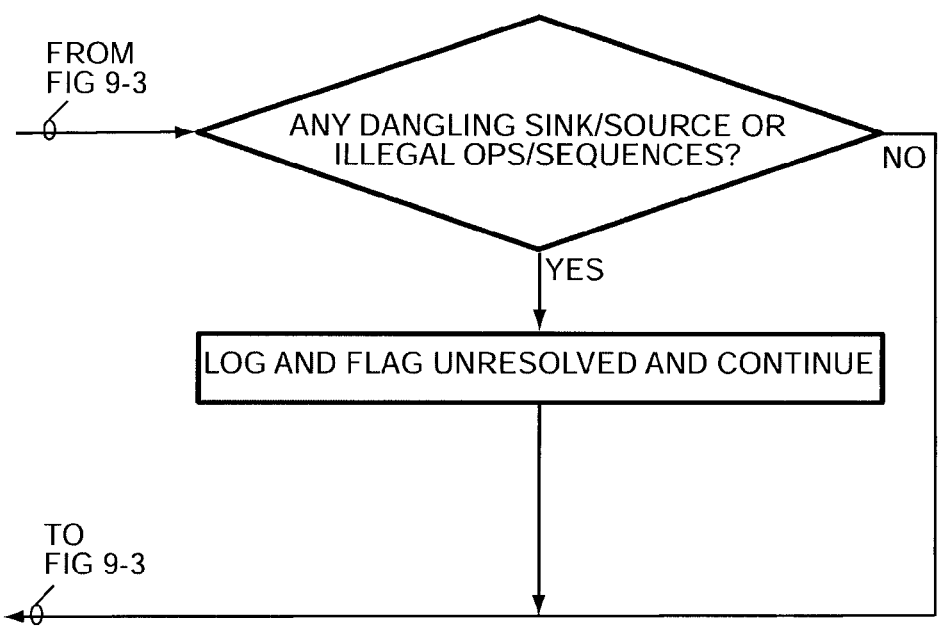
FIG. 5 depicts a table including HDL source code and a corresponding IO sink_source list generated from analysis by the assertion generation system of FIG. 1 according to one embodiment.

FIG. 5 depicts a table including HDL source code and a corresponding 10 sink_source list generated from analysis by the assertion generation system of FIG. 1 according to one embodiment. Table 500 may includes a design HDL code column 502 that includes example Verilog code for an adder block in the depicted embodiment. Table 500 may also include a list column 504 depicts a list generated by the assertion generation system 102 according to one embodiment. The assertion generation system 102 may scan or parse the code (of column 502), analyze the code (such as by assertion analyzer 110) and generate a list of input ports, output ports, sink of a port, source of an output, and the like. A user may review the generated IO sink_source list and may optionally note exceptions to the list. For example, if one port of the list is currently listed as an input and the user knows that it will become bidirectional instead, the user may note an exception to that input and mark the port as INOUT. The list may provide a consistent internal data representation for the algorithms and processes of the disclosed embodiments. The assertion generation system 102 may generate the list from the design HDL lists provided for a design as well as by parsing any design module HDL files.

Figure 6:
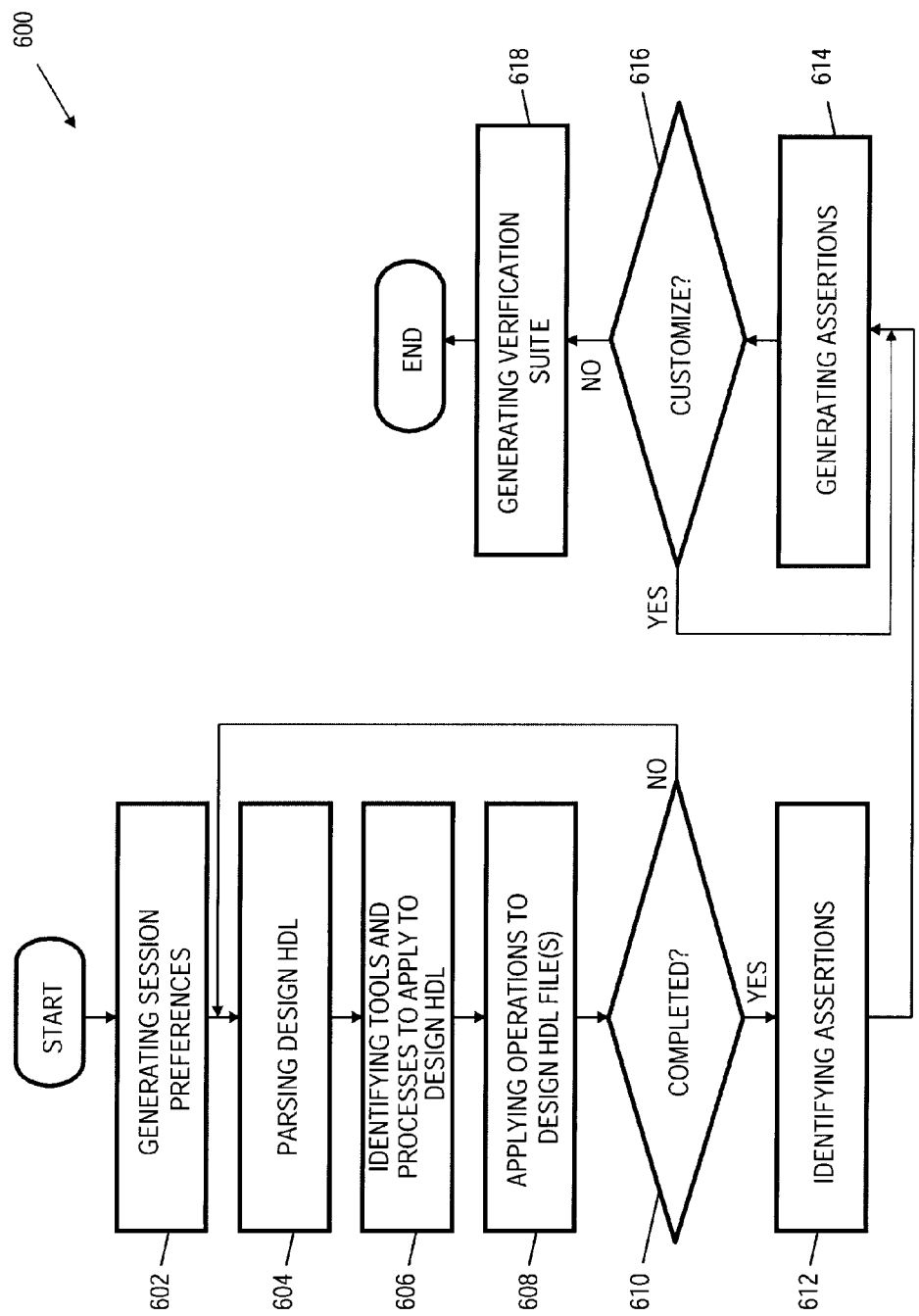
FIG. 6 depicts an example of a flow chart depicting an exemplary assertion generation algorithm according to one embodiment.

FIG. 6 depicts an example of a flow chart depicting an exemplary assertion generation algorithm according to one embodiment. The elements of flow chart 600 may be performed, in one embodiment, by components or combinations of components of the assertion generation system 102 such as the assertion generator 106. Flow chart 600 begins with element 602, generating session preferences. At element 602, the assertion generator 106 may generate session preferences by determining which assertion schema will be applicable to the design. In one embodiment, the assertion generator 106 may generate session preferences by receiving input (such as via user interface 112) relating to which types of assertions will be needed for the design, where assertion types may include input, output, interconnect, protocol, and so on. The user in this embodiment may select assertion schema directly from an assertion schema library (such as database 114), may modify assertion schema from the library, or may fully define new assertion schema. If the user does not specify particular assertion schema for use, the assertion generator 106 may select default assertion schema. A set of default assertion schema may be defined for particular projects, designs, user preferences, or the like.

After generating session preferences, the assertion generator 106 may parse the design HDL at element 604 by identifying the languages used in the design and the hierarchy of the design. In one embodiment, the assertion generator 106 may identify the language (e.g., VHDL, Verilog, or other HDL languages) used with any of the blocks of the design, as the assertions generated subsequently may need to be modified to accommodate the HDL languages used. For example, an assertion written for Verilog may be different than one written for VHDL. The assertion generator 106 may advantageously support any number of different languages so that a design may have blocks specified in different languages. The assertion generator 106 may also identify the hierarchy of the design when parsing the design HDL, such as by identifying the connections between design blocks, which blocks may be located within others, and so on. As part of parsing the design HDL, the assertion generator 106 may analyze the design architecture, structure, and/or hierarchy.

After parsing the design HDL, the assertion generator 106 may identify any tools or processes necessary to parse the design at element 606. In one example, specific tools may be necessary to decompose the code of a particular block, such as one written in a proprietary language. The assertion generator 106 may then access and apply the operations of the tools or processes to the design HDL files to provide access to the code at element 608. The specific tools and processes may be stored in a knowledge base such as database 114. Using the methodology of element 606 and 608, the assertion generator 106 may scan the code of a block and identify the ports, signals and other components as well as the inputs, outputs, interconnects, protocols, etc. that need to be verified. The assertion generator 106 may also apply a specific tool or utility to generate an IO sink_source list similar to column 504 of FIG. 5. If the assertion generator 106 determines that the entire design has been opened up and parsed at decision block 610, the method of flow chart 600 may continue to element 612; otherwise, the method of flow chart 600 returns to element 604 for continued parsing.

At element 612, the assertion generator 106 may identify the assertions that will be inserted or embedded into the design. The assertion generator 106 may accomplish the identification by looking at the selections the user made regarding which assertion schema to use (as described in relation to element 602), including assertion schema directly from the library, modified assertion schema, or fully customized assertion schema. The assertion generator 106 may also use default schema in situations where the user did not make a valid choice. In one embodiment, the assertion generator 106 may choose different libraries of assertion schema, such as based on user preference or other factors. For example, a user may select to use the most current library or an archived version of the library depending on their particular needs.

The assertion generator 106 may next generate the assertions at element 614 by creating snippets of code by customizing the assertion for every net, port, signal or element in the design that it applies. In one embodiment, the assertion generator 106 may instantiate the appropriate assertion schema and insert or embed the relevant values for a particular placement in the design (e.g., signal names, block attributes, etc.) to create each assertion snippet. The assertion generator 106 may generate the snippet code in the appropriate language for the design block in which the assertion will be located. After the assertions snippets are generated, the assertion generator 106 may save the snippets and make them available for designers to incorporate into a design to create a complete testbench that can be simulated.

The assertion generator 106 may determine at decision block 616 whether the user desired customization at a block level. A user, for example, could have chosen to treat one block or group of blocks differently than other blocks or could have defined customized templates for any number of blocks or groups of blocks. If the user desired customization, the method of flow chart 600 may return to element 614 for further assertion code refinement based on the user preferences. If no customization is desired or any customization has been accounted for, the method of flow chart 600 continues to element 618, where the verification system 104 may generate a testbench or verification suite that may be taken to simulation, after which the method terminates. The generated testbench or verification suite may include the design with all of the generated assertions inserted into the design.

Figure 7:
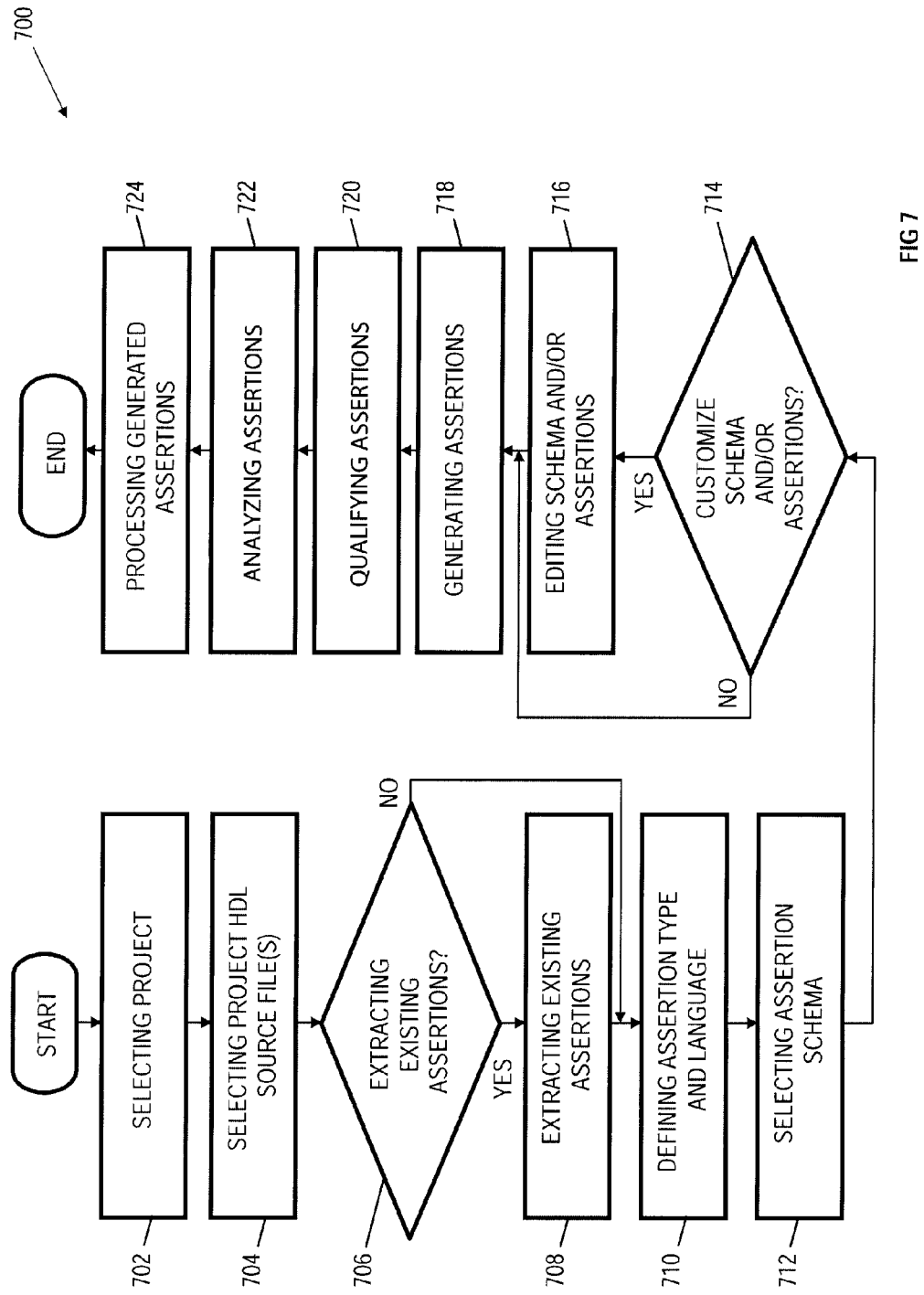
FIG. 7 depicts an example of a flow chart for an exemplary algorithm for generating assertions according to one embodiment.

FIG. 7 depicts an example of a flow chart for an exemplary algorithm for generating assertions according to one embodiment. The elements of flow chart 700 may be performed, in one embodiment, by the assertion generator 106 and/or a user as a more detailed example of elements 612 and 614 of FIG. 6. Flow chart 700 begins with element 702, where a user may select a project for which they wish to verify a design, such as by selecting a project from a list of projects using user interface 112. The assertion generator 106 may optionally determine whether the project is valid and if the project is not valid, prompt the user to select a different project. Next, the user may select one or more project HDL source files for use in generating assertions at element 704. For example, the user may specify one or more directories or file systems from which the assertion generator 106 may acquire various design module HDL source codes or associated files.

The method of flow chart 700 may then continue to decision block 706, where the assertion generator 106 may determine whether the user wishes to extract existing assertions included in a design module to analyze or revise. If the user does wish to extract existing assertions, the assertion analyzer 110 and assertion generator 106 may identify assertions and their code and extract the selected assertions at element 708. If the user does not wish to extract any existing assertions, the method of flow chart 700 may continue to element 710. The assertion analyzer 110 may then identify the appropriate assertion type and language.

After any existing assertions are extracted, if desired, the assertion generator 106 may define one or more assertion types or schema, such as based on user input or the analysis performed by the assertion analyzer 110. In one example, the user may select an assertion type and language from which they would like to choose assertion schemas. The assertion generator 106 may, in one embodiment, start with a default configuration (e.g., Interface assertions and PSL language) and allow the user to select from a list of alternatives. Based on the defined assertion type and language, the user may select particular assertion schemas at element 712. The assertion generator 106 and/or assertion analyzer 110 may compile and display the list of all relevant assertion schema based on the defined type and language and the assertions being updated.

The assertion generator 106 may inquire of the user at decision block 714 whether the user desires to customize or edit any of the schema or assertions. If the user does wish to customize or edit any schema or assertions, they may do so at element 716. The assertion generator 106 may save any revised schemas or assertions in the libraries. If the user does not wish to customize or edit any schema or assertions, the method of flow chart 700 continues to element 718.

The assertion generator 106 may generate assertions at element 718 based on the user preferences and selections as well as the particular design. The assertion generator 106 may instantiate the selected assertion schema (as selected at element 712) and insert or embed the relevant values for a particular placement in the design (e.g., signal names, block attributes, etc.) to create each assertion snippet. The assertion generator 106 may generate the snippet code in the language selected at element 710. The assertion generator 106 may insert the assertion snippets into the design HDL at element 718. After the assertion snippets are generated, the assertion qualifier 108 may qualify generated assertions to ensure consistency and compliance with selected schemas and specified requirements at element 720. At element 722, the assertion analyzer 110 may analyze the generated assertions. Analysis of the generated assertions may include optionally performing a syntax or signal check on the revised schema or assertions to improve accuracy. In another embodiment, analysis of the generated assertions may include analyzing generated assertions to ensure completeness based on attributes assigned at elements 710, 712, and 716. Processing the generated assertions at element 724 may include modifying the generated assertions based on the results of the qualification or analysis, saving the generated assertions, displaying the generated assertions to the user, generating an error log or temporary file. In a further embodiment, processing the generated assertions may including provide an opportunity for the user to edit or change any of their selections after examining the results (or reviewing the error log). In this embodiment, elements 718, 720, 722, and 724 may be re-performed as necessary and requested by the user. After processing the generated assertions, the method terminates.

The methodology of FIG. 7 provides an exemplary algorithm that may illustrate the flexibility provided by system of the disclosed embodiments. The disclosed system may advantageously be an open system that allows users to customize and optimize to any level that they desire, including by customizing at the block level, the template level, how templates are applied, and so on.

FIG. 8 depicts an example of a flow chart for generating an interface assertion according to one embodiment. The elements of flow chart 800 may be performed, in one embodiment, by the assertion generator 106, assertion qualifier 108, and/or assertion analyzer 110 as a more specific and detailed example of elements 718, 720, 722, and 724 of FIG. 7. Flow chart 800 shows sample code (in Perl syntax) for performing interface assertion generation tasks. Interface assertions 202 may be checkers or monitors applied across all input ports or output ports of a design or one of its constituent blocks. An interface assertion 202, in one embodiment, may verify that a port has been exercised during the simulation by ensuring that a value change was observed (a toggle) or that specified sequences of values were observed. Interface assertions 202 may also monitor or check illegal value combinations and illegal value change sequences. One skilled in the art will recognize that the algorithm of FIG. 8 is only one example and that other algorithms for generating interface assertions 202 may also be utilized.

FIG. 9 depicts an example of a flow chart for generating an interconnect assertion according to one embodiment. The elements of flow chart 900 may be performed, in one embodiment, by the assertion generator 106, assertion qualifier 108, and/or assertion analyzer 110 as a more specific and detailed example of elements 718, 720, 722, and 724 of FIG. 7. Flow chart 900 shows sample code (in Perl syntax) for performing interface assertion generation tasks. Interconnect assertions 204 may be checkers or monitors assigned to ports and nets connected either directly (first level interconnect) or indirectly (multilevel interconnect). The connectivity of a block's external ports and internal nets may be verified by methods of value propagation. The interconnect assertion 204 may then flag any port not exercised as a potential disconnect. The interconnect assertion 204 may also flag any exercised port that does not generate a value propagation. This concept may be propagated forward down a path starting from an input port or propagated backward from any output port. The disclosed algorithm may also support traversing down multiple paths to cover all sinks of an input port or all sources of an output port. Interconnect assertions 204 may generally be classified as a primary input port and an internal net/port, two internal net/ports, or an internal net/port and a primary output port. One skilled in the art will recognize that the algorithm of FIG. 9 is only one example and that other algorithms for generating interconnect assertions 204 may also be utilized. While interface assertions 202 and interconnect assertions 204 are described in relation to FIGS. 8 and 9, respectively, the disclosed methods may be utilized with any type of assertion.

Figure 10:
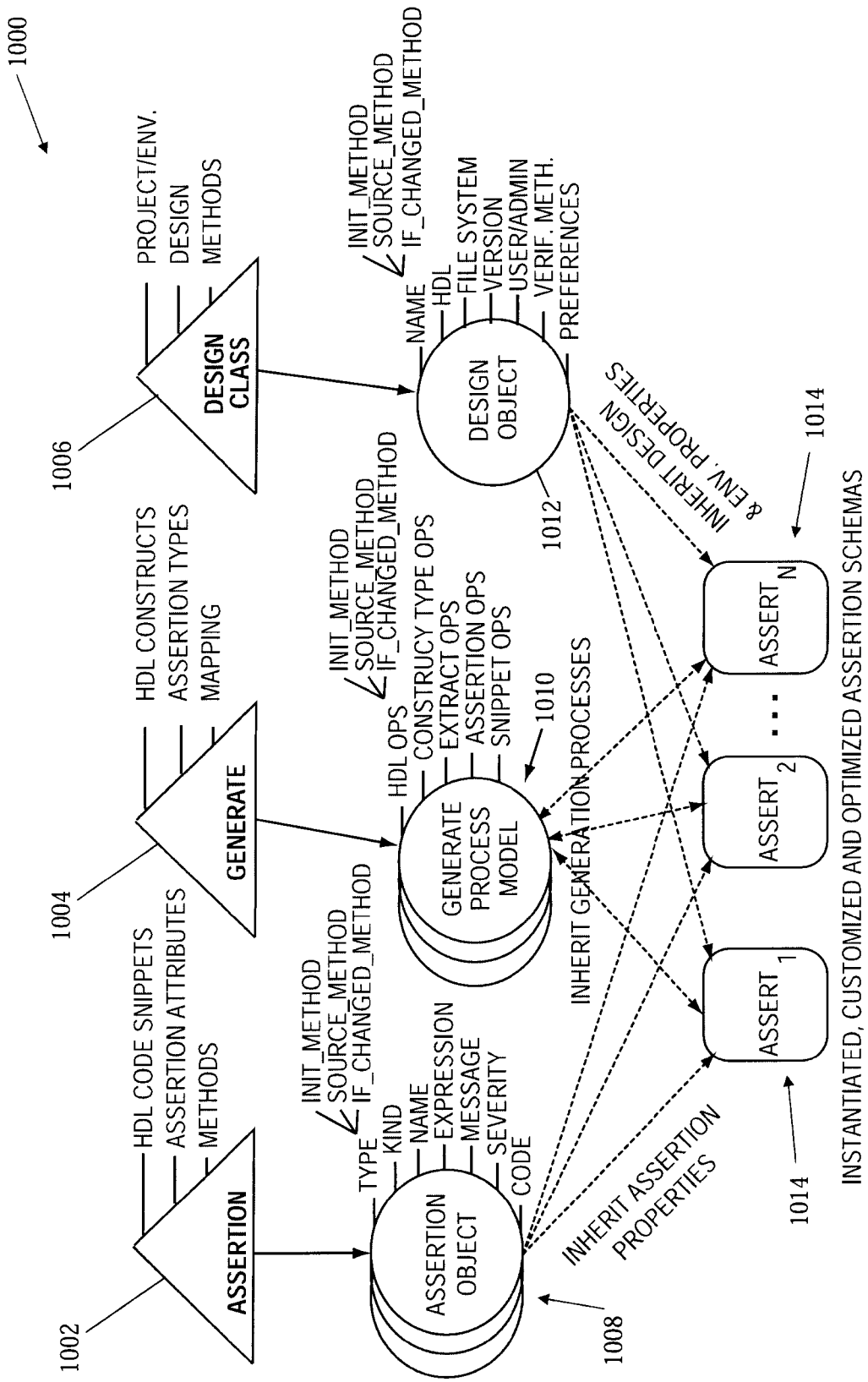
FIG. 10 depicts an object-oriented view of the assertion generation system according to one embodiment.

FIG. 10 depicts an object-oriented view of the assertion generation system according to one embodiment. The assertion generation system 1000 may provide an object-oriented view of assertion generation and instantiation according to the methodology of the disclosed embodiments. The assertion generation system 1000 may include three object classes, an assertion class 1002, a generate class 1004, and a design class 1006. Each class may generate one or more objects such as the assertion objects 1008, generate process model objects 1010, and design objects 1012. Instantiated objects from the three classes may all contribute to generating and instantiating one or more assertions 1014 for use in verifying a design.

Assertion class 1002 may provide assertion properties from a library that may be used to generate specific assertion property objects to be inherited by assertions 1014. Instantiated assertions 1014 may thus inherit assertion properties and attributes from assertion and schema libraries through assertion objects 1008. For example, the assertions 1014 may inherit assertion attributes from different templates of the assertion schema library. Similarly, the instantiated assertions 1014 may inherit design and environment properties from the design class 1006 and the instantiated design object 1012. For example, the instantiated assertions 1014 may inherit information about the design (which blocks are connected to which, number of ports, and so on) as well as the environment (which HDL, which version, etc.). The assertions 1014 may additionally inherit attributes specified by the designer from the generate class 1004 and generate process model objects 1010, such as preferences or selections specified by the user.

Using the assertion generation system 1000, a user may provide information, selections, and/or preferences and have the system 1000 extract information from the design and environment to instantiate assertion objects. An assertion object may be instantiated and evaluated for the entire population of assertions and then customized for each instance. For example, a designer may modify the "Interface Assert Object" properties, property value, or property methods and the changes may then apply to all interface assertions generated subsequently. Each interface assertion may have a unique name and different sink or source but each may share other attributes, methods and values of the "Interface Assert Object". The designer may then review assertion models and make changes to the model schema used for a class of assertions (and have the changes propagated to all assertions based on that class), make changes to one or more of the assertions only, make changes to all assertions for a particular or group of blocks or functions, and so on. In addition to the global customization, a user may apply specific changes to all objects of a query.

In combination, the three classes 1002, 1004, 1006 advantageously may provide an open and flexible framework for instantiating customized and optimized assertion schema that is visible to designers. Moreover, the assertion generation system 1000 may provide for global and specific customization of any aspect or attribute of assertions by users while taking advantage of automatic adaptation to the design and environment.

Figure 11:
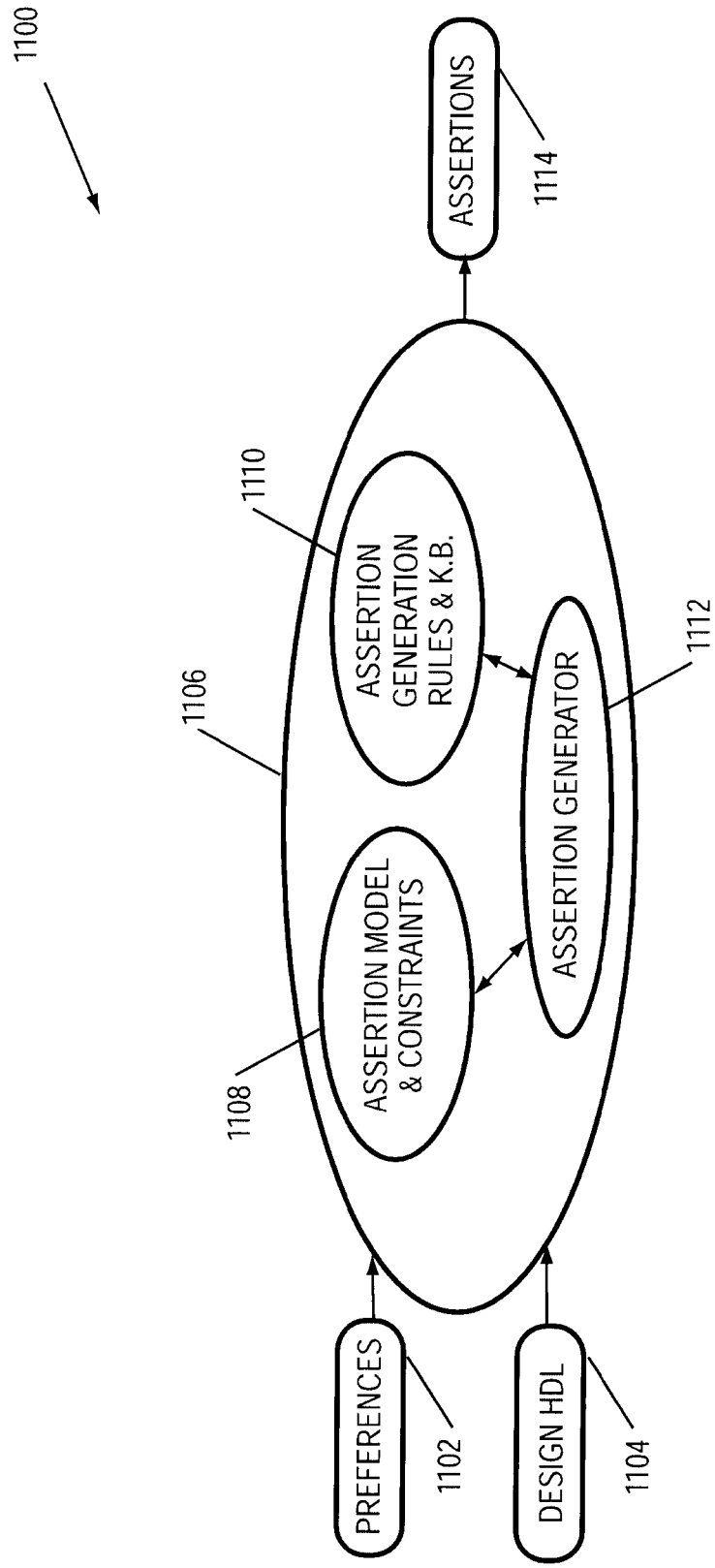
FIG. 11 depicts a schematic view of the model-based architecture of the assertion generation system according to one embodiment.

FIG. 11 depicts a schematic view of the model-based architecture of the assertion generation system according to one embodiment. The model-based assertion generation system 1100 may utilize both preferences 1102 and the design HDL 1104 as inputs to its assertion generation system 1106. The assertion generation system 1106 may generate assertions 1114 based on its inputs and internal operations. The assertion generation system 1106 may take into account preferences of a designer or other user from the preferences 1102 module. For example, the user may express a preference that all inputs of a particular block or group of blocks be handled in a certain way. The assertion generation system 1106 may also take into account the actual design code at design HDL 1104, such as by parsing the code to determine where the inputs are, where the outputs are, and so on.

The assertion generation system 1106 may include an assertion generator 1112 for generation assertions, as described previously. The assertion generator 1112 may work with an assertion models and constraints 1108, such as assertion schemas stored in libraries. The assertion generator 1112 may also work with assertion generation rules and knowledge base 1110 specified, for example, on a project-basis. A model-based system such as the assertion generation system 1106 may be comprised of several independent components, as illustrated, and the final result (i.e., the assertions 1114) may be based on and influenced by all relevant models and methods. Changes in the inference may impact the quality of results for the same set of models and changes in any of the models may impact the result of such a system. To help ensure the integrity and predictable quality of solutions, system operators may continue to develop and maintain the assertion generation system 1106 and guide users in ways to take advantage of its features. The object-oriented method of system 1000 and the model-based method of system 1100 and other programming methods described herein are only examples of how the disclosed system may be developed and deployed.

Each software program described herein may be operated on any type of computer, such as a personal computer, server, etc. Any program may be contained on a variety of storage devices. Illustrative storage devices include, but are not limited to: (i) information permanently stored on non-writable storage media (e.g., read-only memory devices within a computer such as CD-ROM disks readable by a CD-ROM drive); and (ii) alterable information stored on writable storage media (e.g., floppy disks within a diskette drive or hard-disk drive). Such storage devices, when carrying computer-readable instructions that direct the functions of the present invention, represent embodiments of the present invention.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

It will be apparent to those skilled in the art having the benefit of this disclosure that the present invention contemplates methods, systems, and media for block-based assertion generation, qualification and analysis. It is understood that the form of the invention shown and described in the detailed description and the drawings are to be taken merely as examples. It is intended that the following claims be interpreted broadly to embrace all the variations of the example embodiments disclosed.

What is claimed is:

1. A machine-accessible medium of a storage device containing instructions of a computer readable program effective, when executing in a data processing system, to cause said data processing system to perform operations comprising:

generating session preferences by a module of the computer readable program, the session preferences including a selection of one or more assertion schemas for use in generating one or more assertions, the selected assertion schemas each having one or more associated design attributes;

parsing the design to determine locations in the design for the one or more assertions based on architecture, structure, and hierarchy of the design; and generating the one or more assertions based on the session preferences, the determined locations for the one or more assertions, and the design attributes associated with the selected assertion schema, wherein generating the one or more assertions comprises:

instantiating the selected assertion schema;

generating assertion snippets based on the instantiated assertion schema and session preferences and associated design attributes; and embedding the assertion snippets in the design, source code, or in a design assertion file.

2. The machine-accessible medium of claim 1, further comprising customizing assertion code for one or more design blocks, wherein the one or more design blocks comprise one or more of a design unit, a design sub_unit, a function, or a HDL module.

3. The machine-accessible medium of claim 1, further comprising:
   identifying one or more tools or processes to apply to the design; and
   applying operations associated with the identified one or more tools or processes to the design to identify a type of assertions required by the design and signals, ports, and nets associated with each.

4. The machine-accessible medium of claim 1, wherein parsing the design comprises identifying languages used in the design, a hierarchy of the design, and verification environment requirements and attributes.

5. An assertion generation system for generating assertions for use in verifying a design, the system comprising:
   a user interface, the user interface being adapted to receive an indication of session preferences from a user, the indication of session preferences including one or more selected assertion schemas for use in generating assertions;
   an assertion generator in communication with the user interface, the assertion generator being adapted to generate one or more assertions based on the session preferences, the assertion generator being further adapted to embed the one or more assertions into the design;
   an assertion analyzer in communication with the assertion generator, the assertion analyzing being adapted to analyze and optimize the one or more assertions generated by the assertion generator;
   an assertion qualifier in communication with the assertion generator, the assertion qualifier being adapted to check the coverage and compliance of the one or more assertions generated by the assertion generator; and
   wherein the assertion generator instantiates the one or more selected assertion schemas, generates assertion snippets based on the instantiated assertion schemas and session preferences and associated design attributes, and embeds the assertion snippets in the design, source code, or in a design assertion file.

6. The system of claim 5, further comprising a database having a library containing one or more assertion schemas.

7. The system of claim 5, further comprising a verification system, the verification system being adapted to verify the design with the one or more embedded assertions.

8. The system of claim 5, wherein the session preferences comprise one or more of a selection of an assertion schema from a library, a modification of an assertion schema from a library, and a fully customized assertion schema.

* * * * *